United States Patent
Sato

(10) Patent No.: US 11,740,554 B2
(45) Date of Patent: Aug. 29, 2023

(54) IMPRINT APPARATUS AND METHOD OF MANUFACTURING ARTICLE

(71) Applicant: CANON KABUSHIKI KAISHA, Tokyo (JP)

(72) Inventor: Hiroshi Sato, Utsunomiya (JP)

(73) Assignee: CANON KABUSHIKI KAISHA, Tokyo (JP)

(*) Notice: Subject to any disclaimer, the term of this patent is extended or adjusted under 35 U.S.C. 154(b) by 623 days.

(21) Appl. No.: 16/594,461

(22) Filed: Oct. 7, 2019

(65) Prior Publication Data
US 2020/0117084 A1    Apr. 16, 2020

(30) Foreign Application Priority Data

Oct. 11, 2018 (JP) .................... 2018-192810
Sep. 12, 2019 (JP) .................... 2019-166495

(51) Int. Cl.
G03F 7/00 (2006.01)
G03F 7/20 (2006.01)
G03F 9/00 (2006.01)
G03F 7/004 (2006.01)

(52) U.S. Cl.
CPC .......... *G03F 7/0002* (2013.01); *G03F 7/7065* (2013.01); *G03F 7/70633* (2013.01); *G03F 7/70683* (2013.01); *G03F 7/0041* (2013.01)

(58) Field of Classification Search
CPC .. G03F 7/0002; G03F 7/70633; G03F 7/7065; G03F 7/70683; G03F 9/7042; G03F 9/7084; G03F 9/7088
See application file for complete search history.

(56) References Cited

U.S. PATENT DOCUMENTS

| 9,625,811 B2 | 4/2017 | Wuister |
| 2004/0022888 A1* | 2/2004 | Sreenivasan ........... B82Y 40/00 425/810 |
| 2008/0225254 A1* | 9/2008 | Komine ................ G03F 9/7076 430/5 |
| 2009/0095711 A1 | 4/2009 | Koshiba |

(Continued)

FOREIGN PATENT DOCUMENTS

| JP | 2009088264 A | 4/2009 |
| JP | 2011097025 A | 5/2011 |

(Continued)

*Primary Examiner* — Joseph S Del Sole
*Assistant Examiner* — Baileigh Kate Darnell
(74) *Attorney, Agent, or Firm* — Rossi, Kimms & McDowell LLP

(57) ABSTRACT

The present invention provides an imprint apparatus for forming a pattern in an imprint material on a substrate using an original, comprising: an image capturing unit configured to capture an image of the substrate; and a processor configured to perform, based on fine-detection marks and rough-detection marks in the image obtained by the image capturing unit, an alignment process of the original and the substrate in forming the pattern in the imprint material, and overlay inspection of the substrate and the pattern formed in the imprint material, wherein the processor is configured to change, between the alignment process and the overlay inspection, a rough-detection mark group to be used to specify positions of fine-detection marks in the image obtained by the image capturing unit.

10 Claims, 15 Drawing Sheets

(56) References Cited

U.S. PATENT DOCUMENTS

2011/0074064 A1    3/2011  Hayashi
2015/0049317 A1*  2/2015  Mishima ............ G03F 7/70141
                                                      355/67
2016/0207248 A1    7/2016  Sato

FOREIGN PATENT DOCUMENTS

| JP | 2013514638 A | 4/2013 |
|----|--------------|--------|
| JP | 2013157548 A | 8/2013 |
| JP | 2016134441 A | 7/2016 |
| JP | 2017103296 A | 6/2017 |
| KR | 1020130088770 A | 8/2013 |
| KR | 1020150020308 A | 2/2015 |
| WO | 2011072897 A1 | 6/2011 |

* cited by examiner

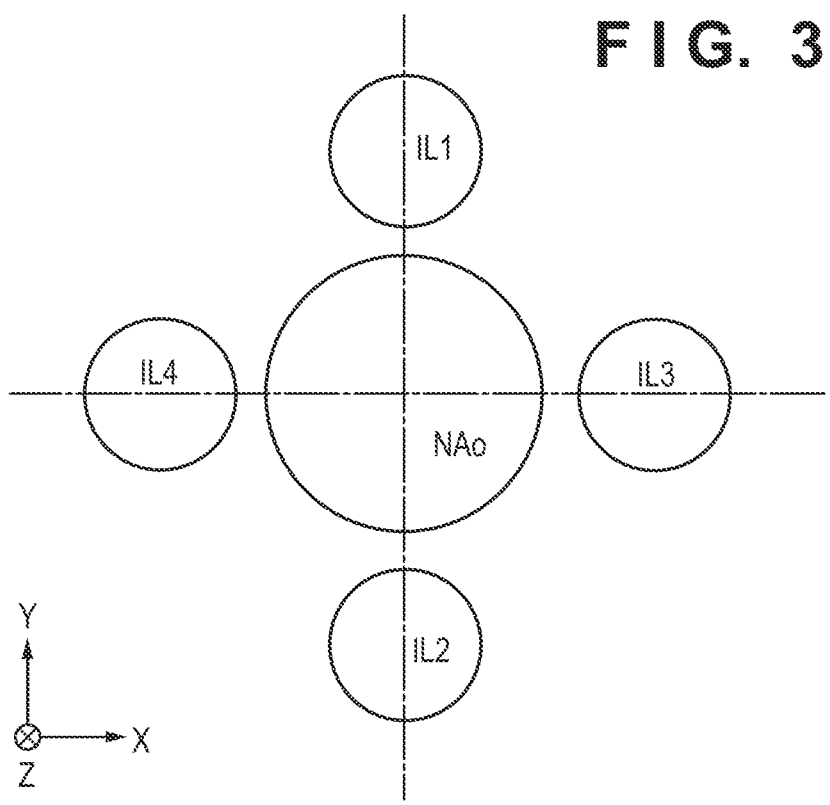
FIG. 3
FIG. 4A 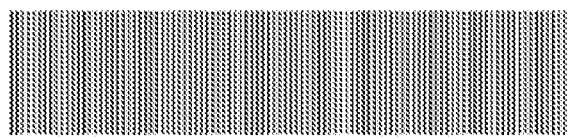 ~31 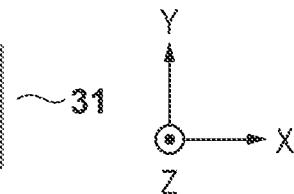
FIG. 4B 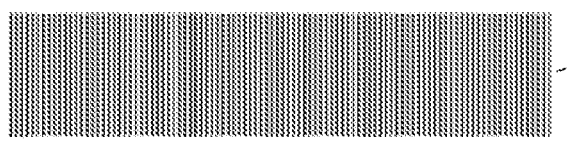 ~32 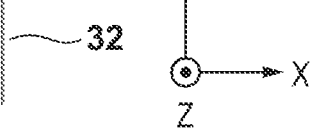
FIG. 4C 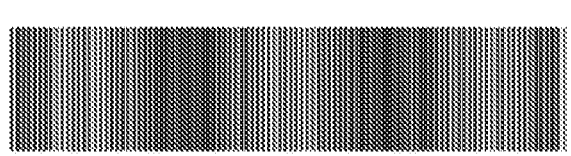 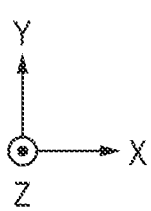
FIG. 4D 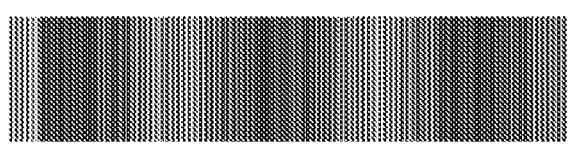 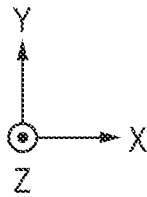

F I G. 5A  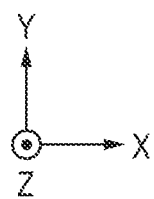
F I G. 5B  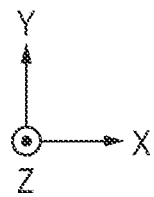
F I G. 5C  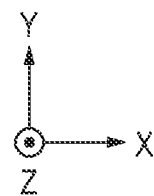
F I G. 5D  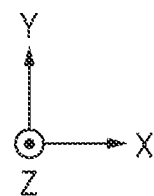

FIG. 8A
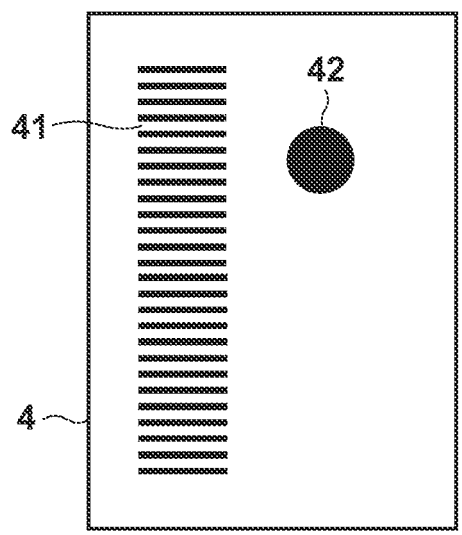
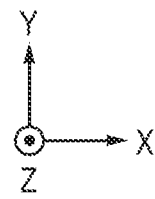
FIG. 8B
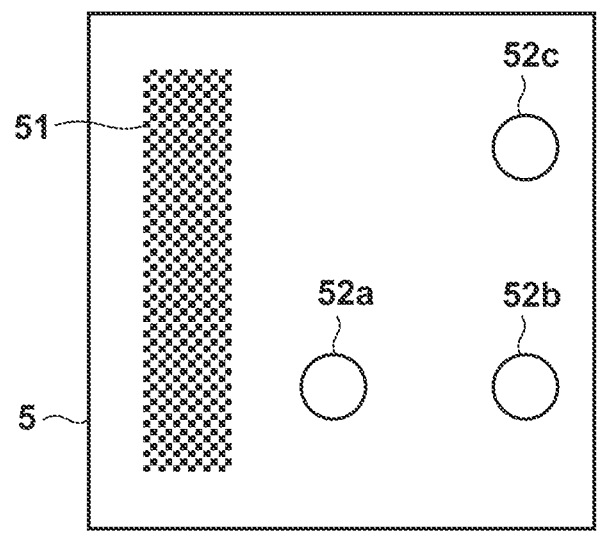
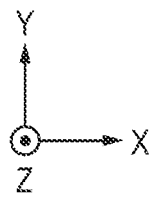

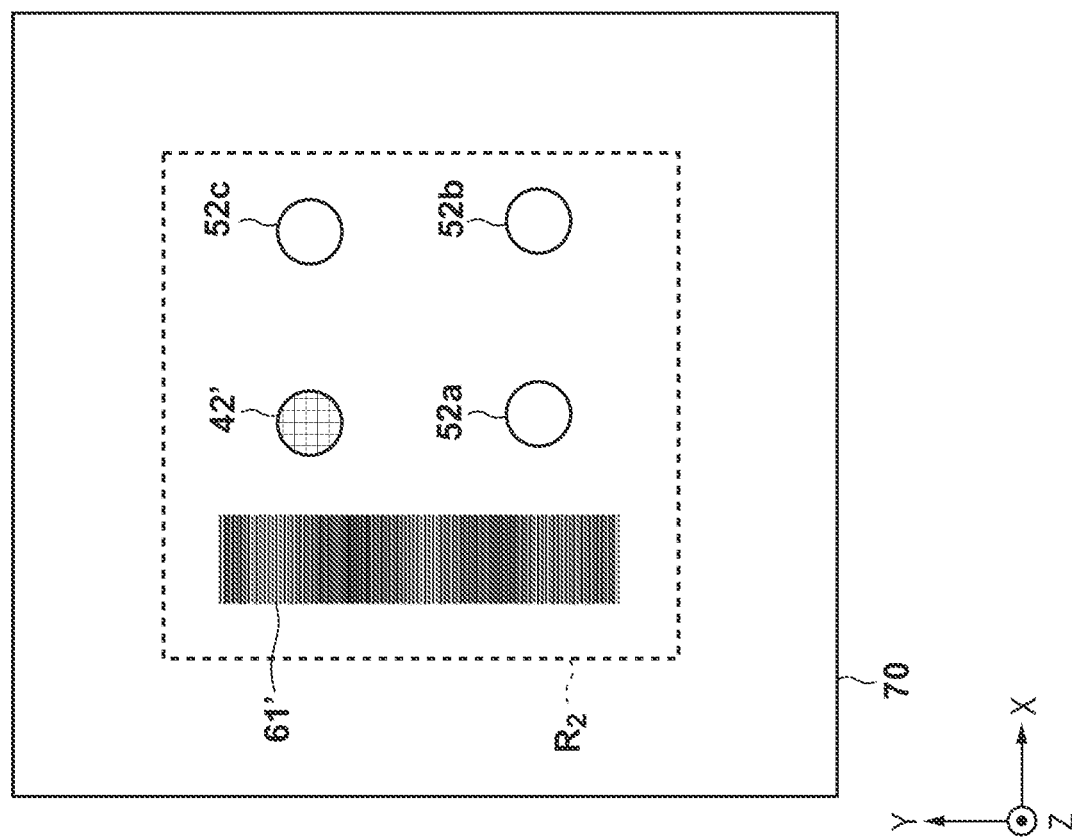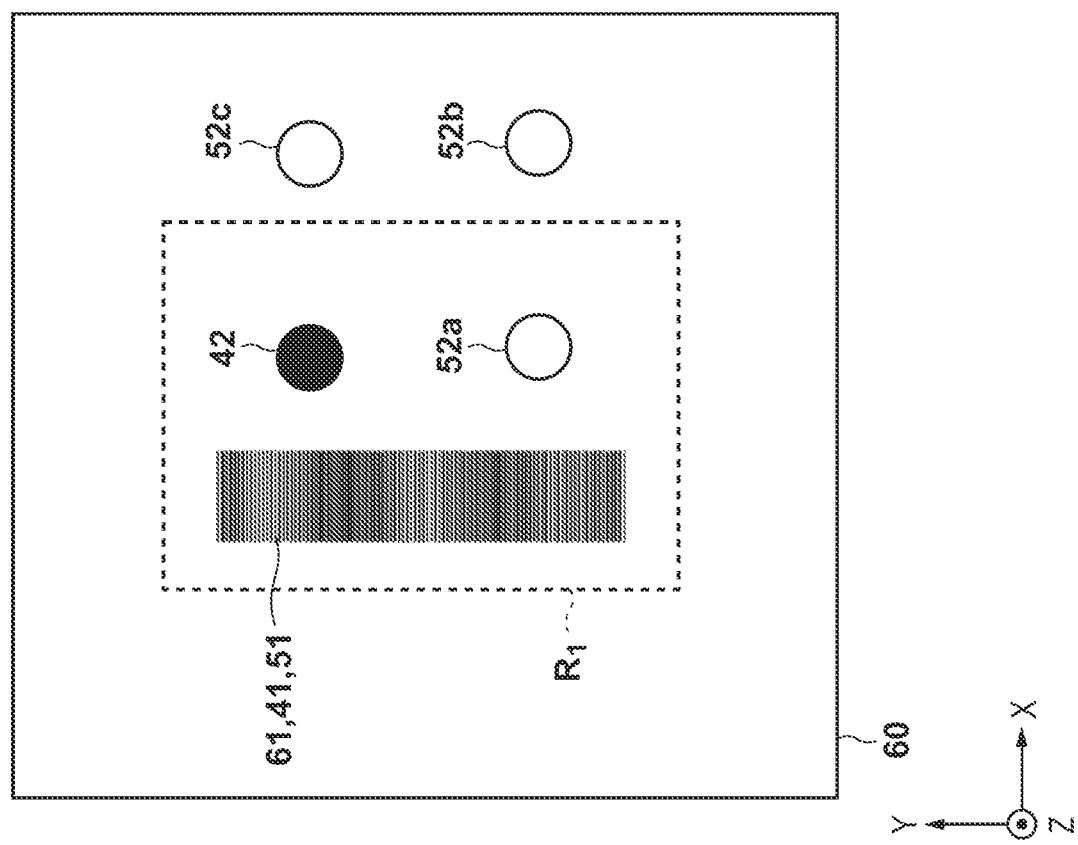

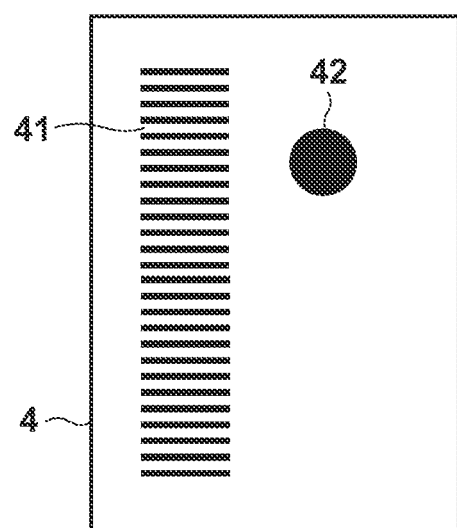
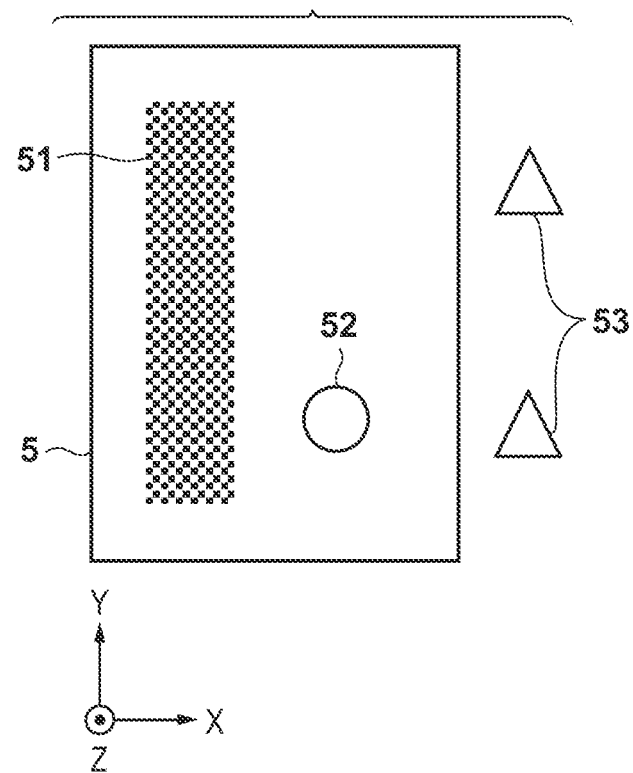

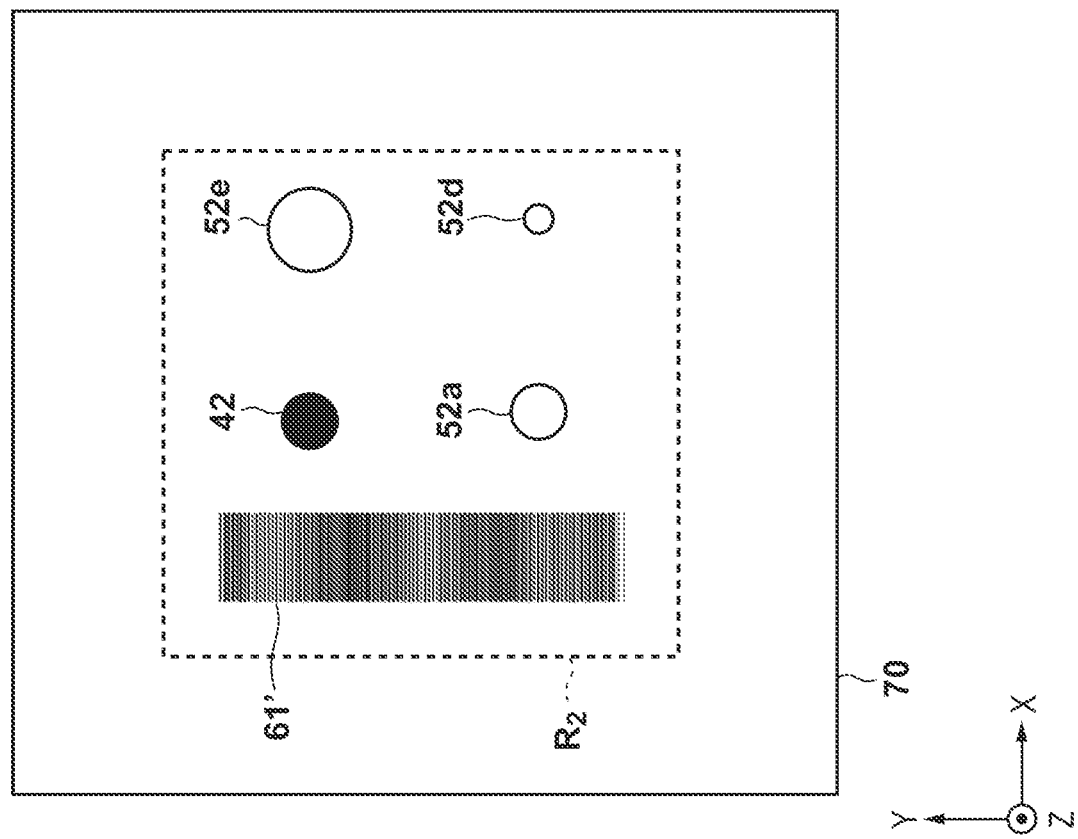
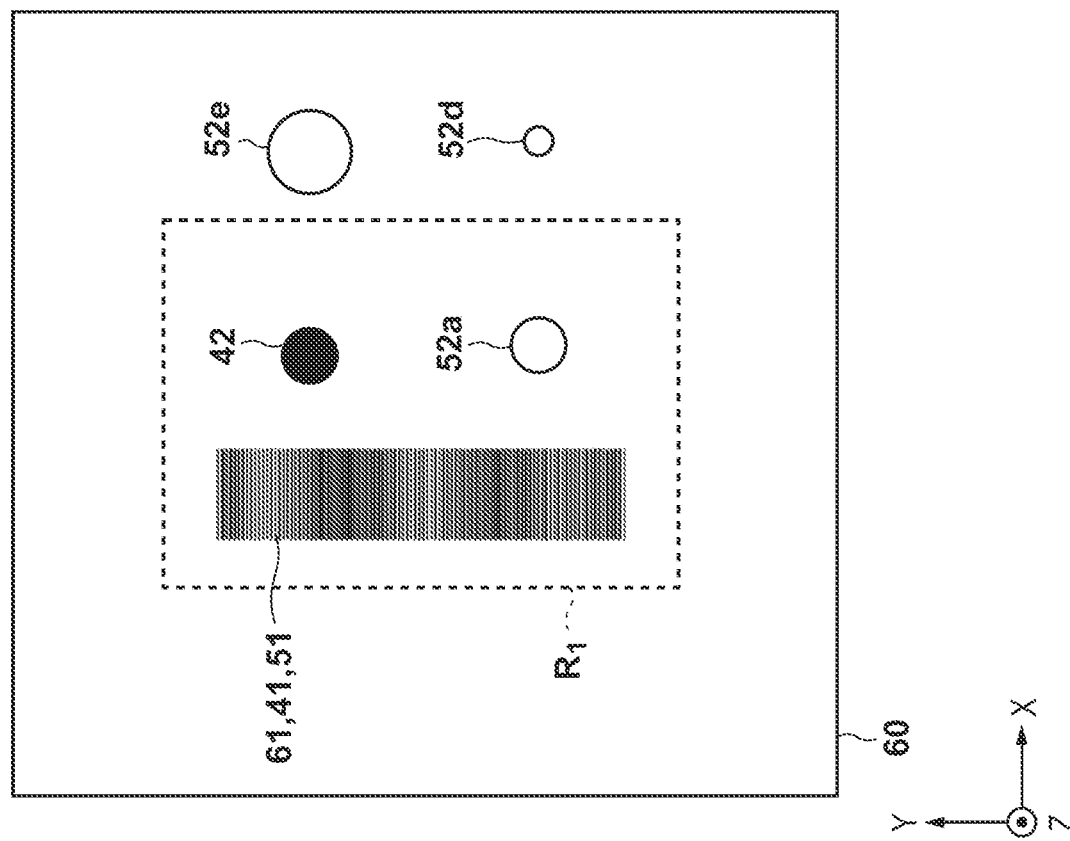

IMPRINT APPARATUS AND METHOD OF MANUFACTURING ARTICLE

BACKGROUND OF THE INVENTION

Field of the Invention

The present invention relates to an imprint apparatus and a method of manufacturing an article.

Description of the Related Art

An imprint apparatus that forms the pattern of an imprint material on a substrate using a mold (original) with an uneven pattern has received attention as one of lithography apparatuses used for mass production of a semiconductor device or the like. An imprint apparatus can employ a die-by-die alignment method as an alignment process method for a mold and a substrate. The die-by-die alignment method is an alignment method of optically detecting a mark provided in an original and a mark provided in a substrate for each of a plurality of shot regions of the substrate and correcting the shift of the positional relationship between the original and the substrate.

In an imprint apparatus employing the die-by-die alignment method, the overlay accuracy of a pattern already formed in a substrate and a pattern formed in an imprint material on the substrate may be different for each shot region. Therefore, the imprint apparatus is desired to inspect the overlay accuracy in the apparatus so as to quickly reflect the inspection result of the overlay accuracy on a subsequent alignment process. Japanese Patent Laid-Open No. 2011-97025 and Japanese Patent Laid-Open No. 2009-88264 each disclose an imprint apparatus configured to inspect the overlay accuracy in the apparatus.

While an alignment process is performed based on an image obtained by capturing a mark of a mold and that of a substrate, overlay inspection can be performed based on an image obtained by capturing a mark of the substrate and a mark formed (transferred) in an imprint material. However, in the image obtained by the overlay inspection, the signal strength of the mark formed in the imprint material is much smaller than that of the mark of the substrate. Consequently, if the overlay inspection is performed under conditions similar to those for the alignment process, it may be impossible to detect a mark from an image obtained by an image capturing unit or a mark may be erroneously detected.

SUMMARY OF THE INVENTION

The present invention provides, for example, a technique advantageous in accurately performing an alignment process and overlay inspection.

According to one aspect of the present invention, there is provided an imprint apparatus for forming a pattern in an imprint material on a substrate using an original, comprising: an image capturing unit configured to capture an image of the substrate; and a processor configured to perform, based on fine-detection marks and rough-detection marks in the image obtained by the image capturing unit, an alignment process of the original and the substrate in forming the pattern in the imprint material, and overlay inspection of the substrate and the pattern formed in the imprint material, wherein the processor is configured to change, between the alignment process and the overlay inspection, a rough-detection mark group to be used to specify positions of fine-detection marks in the image obtained by the image capturing unit.

Further features of the present invention will become apparent from the following description of exemplary embodiments with reference to the attached drawings.

BRIEF DESCRIPTION OF THE DRAWINGS

FIG. 3 is a view showing the relationship between the numerical aperture of an imaging optical system and the distribution of illumination light on the pupil plane of an illumination optical system;

FIGS. 4A and 4B are views each showing the grating pattern of a diffraction grating (fine-detection mark) forming a mark;

FIGS. 4C and 4D are views each showing moire fringes generated by overlaying of diffracted light components;

FIGS. 5A to 5D are views each showing the grating pattern of the diffraction grating;

FIGS. 8A and 8B are views respectively showing examples of the arrangements of a mark of a mold M and that of a substrate W according to Example 1;

FIGS. 9A and 9B are views each showing an image obtained by an image capturing unit according to Example 1;

FIGS. 11A and 11B are views respectively showing examples of the arrangements of a mark of a mold M and that of a substrate W according to Example 2;

FIGS. 15A and 15B are views each showing an image obtained by an image capturing unit according to the third embodiment.

DESCRIPTION OF THE EMBODIMENTS

Figure 1A:
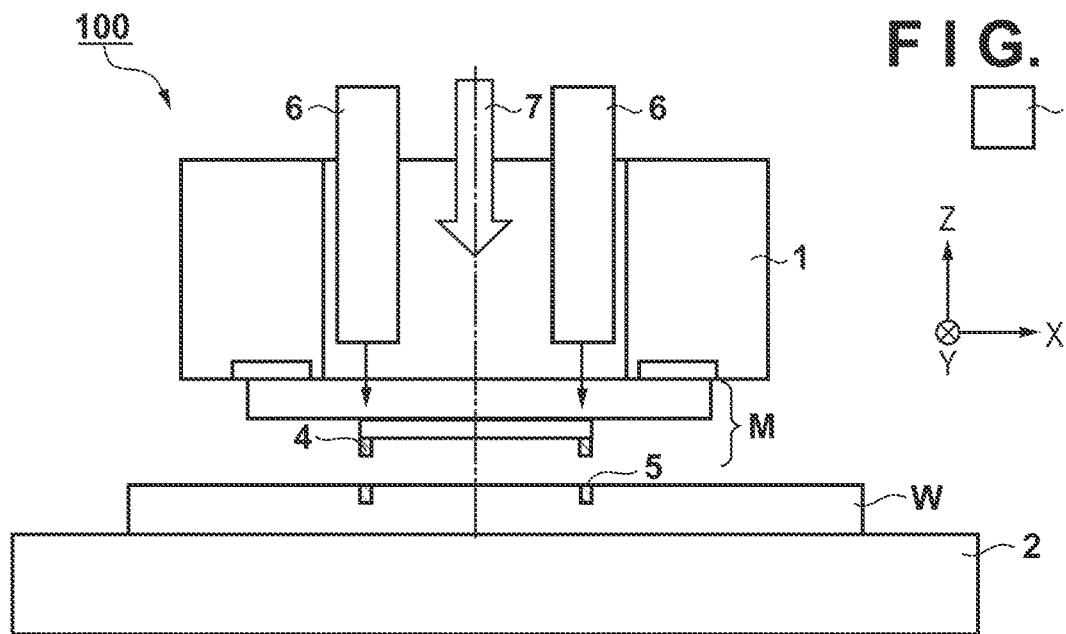
FIGS. 1A and 1B are schematic views each showing the arrangement of an imprint apparatus.

Exemplary embodiments of the present invention will be described below with reference to the accompanying drawings. Note that the same reference numerals denote the same members throughout the drawings, and a repetitive description thereof will not be given.

First Embodiment

Figure 1B:
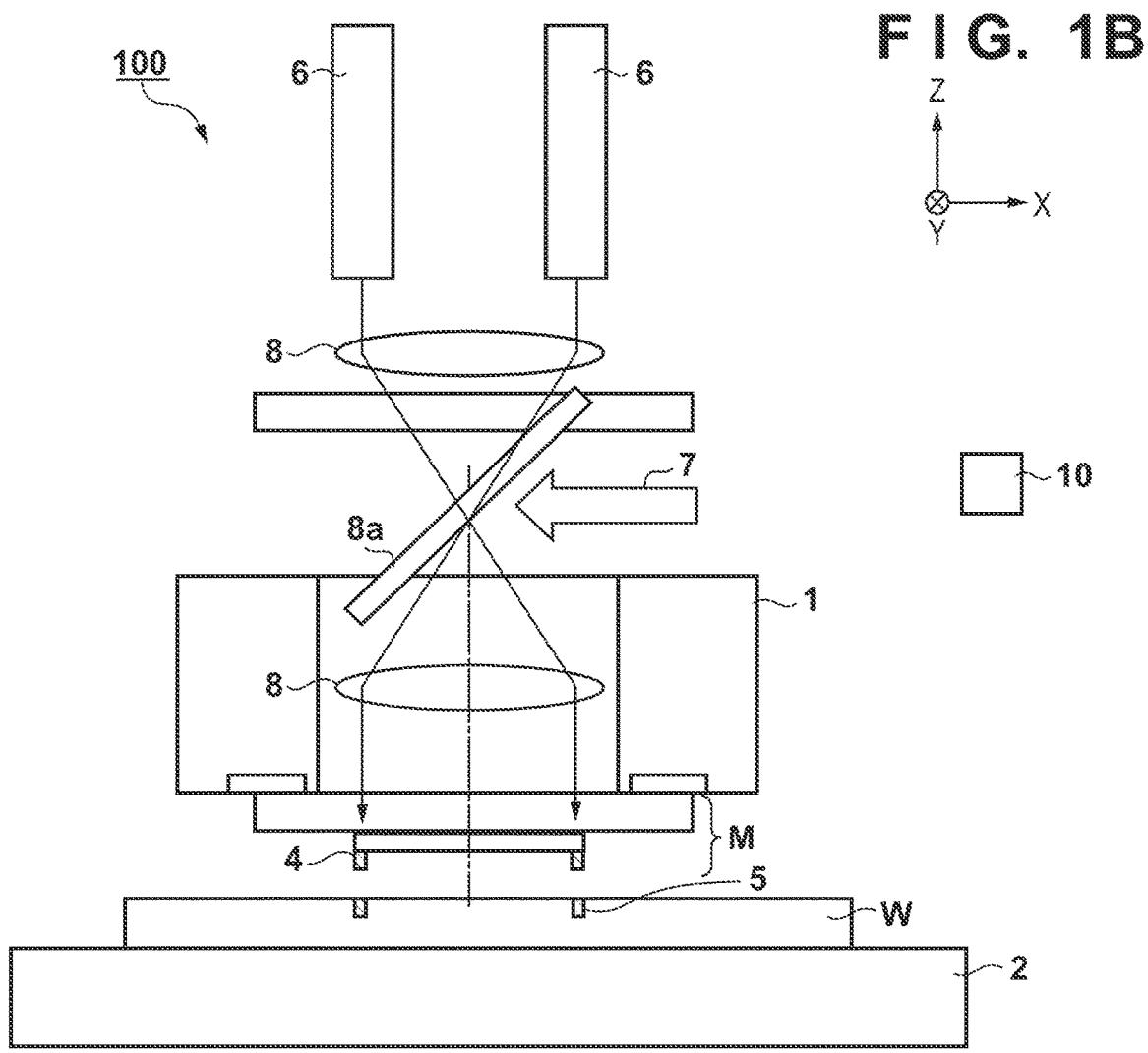

An imprint apparatus 100 according to the first embodiment of the present invention will be described. In this embodiment, an imprint apparatus using a photo-curing method will be explained. FIGS. 1A and 1B are schematic views each showing the arrangement of the imprint apparatus 100 according to this embodiment. The imprint apparatus 100 performs an imprint process of forming a pattern in an imprint material on a substrate using a mold M (original). The imprint apparatus 100 can include, for example, an imprint head 1 that holds the mold M with a predetermined uneven pattern, a substrate stage 2 that is movable while holding a substrate W, image capturing units 6, and a control unit 10. Although not shown in FIG. 1, the imprint apparatus 100 can include a supply unit (dispenser) that supplies (dispenses) the imprint material onto the substrate.

The imprint apparatus 100 brings the mold M (pattern surface) into contact with the imprint material supplied onto the substrate by narrowing the interval between the mold M and the substrate W by the imprint head 1. In the state in which the mold M and the imprint material on the substrate are in contact with each other, the imprint material is irradiated with ultraviolet light 7 to be cured, and the mold M is separated (released) from the cured imprint material. This can form the pattern of the imprint material on the substrate.

The imprint apparatus 100 is provided with the image capturing units 6 (scopes) each of which captures (observes) an image of a mark 4 provided in the mold M and a mark 5 provided in the substrate W. The image capturing units 6 can be arranged in the imprint head 1, as shown in FIG. 1A. However, if it is difficult to arrange the image capturing units 6 in the imprint head 1, the image capturing units 6 may be arranged outside the imprint head 1, as shown in FIG. 1B. In an example shown in FIG. 1B, each image capturing unit 6 can capture an image of the mark 4 of the mold M and the mark 5 of the substrate W via an optical system 8. Each image capturing unit 6 can capture an image of moire fringes generated by light from the mark 4 of the mold M and light from the mark 5 of the substrate W. The optical system 8 shown in FIG. 1B can include an optical member such as a prism 8a having the property of reflecting the ultraviolet light 7 for curing the imprint material and passing light from each image capturing unit 6.

Each of the marks 4 and 5 captured by each image capturing unit 6 can include, as mark elements, a fine-detection mark and a rough-detection mark. The fine-detection mark is a mark for accurately detecting the relative positions of the mold M and the substrate W, and can include, for example, a diffraction grating. The rough-detection mark is a mark for detecting the relative positions of the mold M and the substrate W with an accuracy lower than that of the fine-detection mark, that is, a mark for specifying the position of the fine-detection mark. The fine-detection mark and the rough-detection mark will be conceptually described. For example, if the relative positions of the mold M and the substrate W are represented by two-digit values, it is possible to measure the relative positions in the tens place by the rough-detection marks, and measure the relative positions in the ones place by the fine-detection marks. The fine-detection mark and the rough-detection mark will be described in detail later.

The control unit 10 includes, for example, a CPU and a memory, and controls the overall imprint apparatus 100 (each unit of the imprint apparatus 100). For example, the control unit 10 can control an alignment process of the mold M and the substrate W by moving the imprint head 1 and the substrate stage 2 in the X and Y directions based on images obtained by the image capturing units 6. Furthermore, the control unit 10 can control overlay inspection of the pattern formed in the imprint material and a pattern already formed in the substrate W based on the images obtained by the image capturing units 6. As described above, the control unit 10 according to this embodiment has a function as a processor that performs the alignment process and the overlay inspection. However, the control unit 10 may be formed as a unit separated from the processor.

Arrangement of Image Capturing Unit

Figure 2:
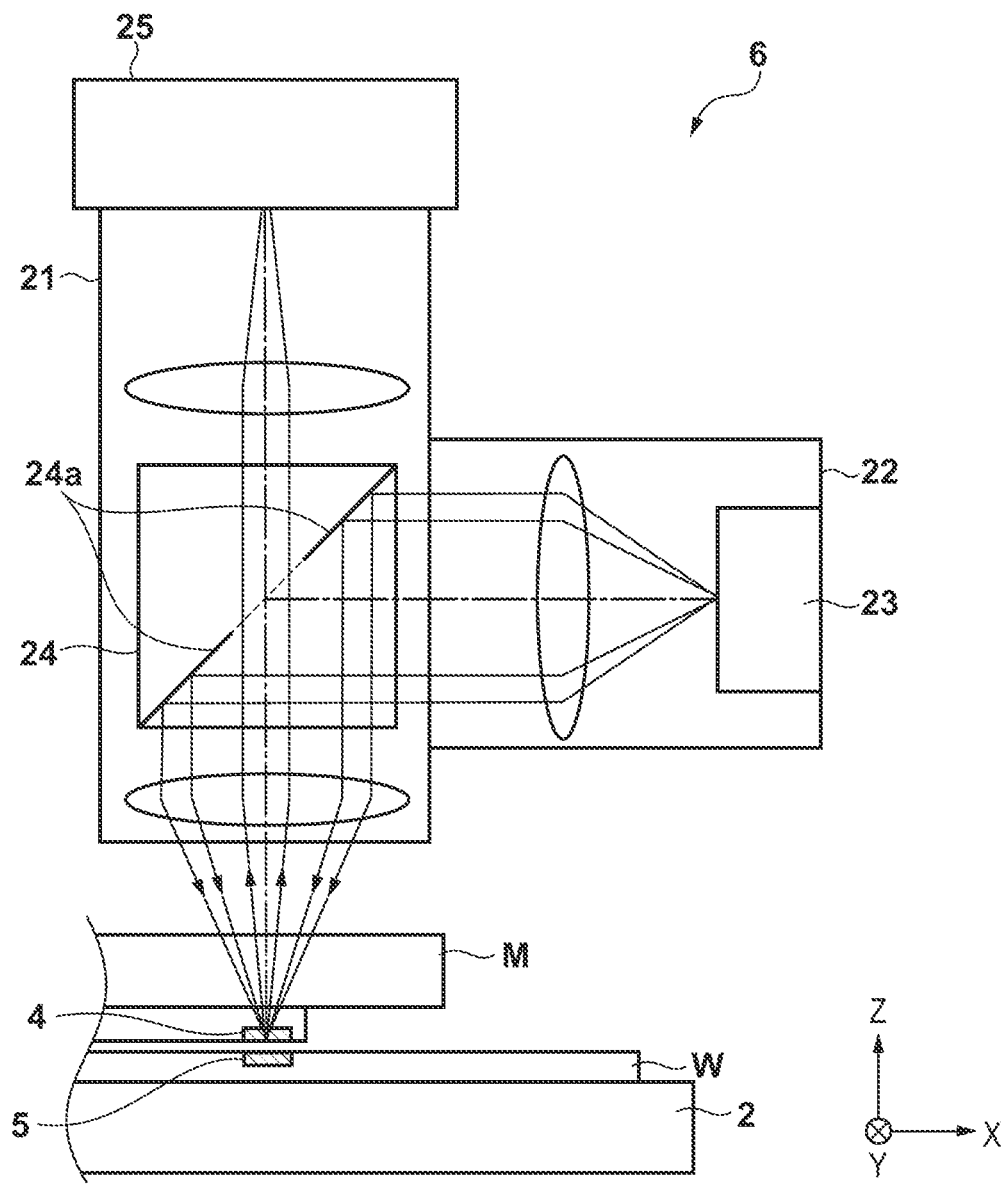
FIG. 2 is a schematic view showing an example of the arrangement of an image capturing unit.

The arrangement of each image capturing unit 6 will be described in detail next. FIG. 2 is a schematic view showing an example of the arrangement of the image capturing unit 6. The image capturing unit 6 can include an imaging optical system 21, an illumination optical system 22, and an image sensor 25 (for example, a CCD sensor or a CMOS sensor). The optical path of the imaging optical system 21 and that of the illumination optical system 22 partially overlap each other, and an optical member such as a prism 24 is arranged in the overlapping portion. In this arrangement, part of the optical axis of the imaging optical system 21 is common with the optical axis of the illumination optical system 22.

The illumination optical system 22 guides light from a light source 23 onto the same optical axis as that of the imaging optical system 21 by the prism 24, and illuminates the mark 4 of the mold M and the mark 5 of the substrate W with the light. The light source 23 preferably emits light having a wavelength different from that of the ultraviolet light 7, and can include, for example, a halogen lamp or an LED. In this embodiment, the ultraviolet light 7 is used as light for curing the imprint material, and thus a light source that emits visible light or ultraviolet light can be used as the light source 23.

The imaging optical system 21 forms, on the light-receiving surface of the image sensor 25, an image of the marks 4 and 5 illuminated by the illumination optical system 22. For example, the imaging optical system 21 forms, on the light-receiving surface of the image sensor 25, a pattern (moire fringes) generated by light components diffracted by the fine-detection mark (diffraction grating) of the mark 4 and the fine-detection mark (diffraction grating) of the mark 5. This allows the image sensor 25 to capture a moire image generated by the mark 4 of the mold M and the mark 5 of the substrate W. Image data thus obtained by each image capturing unit 6 (image sensor 25) is transmitted to the control unit 10. The control unit 10 can obtain the relative positions of the mold M and the substrate W by analyzing the phase of moire generated based on the positions of the marks in the image.

The prism 24 common to the imaging optical system 21 and the illumination optical system 22 is preferably arranged on or near the pupil planes of the imaging optical system 21 and the illumination optical system 22. The prism 24 includes a reflection film 24a for reflecting the light from the peripheral portion of the pupil plane of the illumination optical system 22 on the bonding surface of the prism 24. The reflection film 24a functions as an aperture stop that defines the distribution (shape) of illumination light on the pupil plane of the illumination optical system 22. The reflection film 24a can also function as an aperture stop that defines the size of the pupil of the imaging optical system 21 (or a numerical aperture $NA_O$ of the imaging optical system 21).

The prism 24 here may be a half prism that has a semi-transparent film on its bonding surface or may be replaced by a plate-like optical element having the reflection film on its surface or the like. Alternatively, a plurality of prisms 24 having different opening shapes may be provided so as to change the distribution of the illumination light of the illumination optical system 22 and the size of the pupil of the imaging optical system 21. In this case, the plurality of prisms 24 can be configured so that it is possible to exchange a prism arranged on the optical path by a switching mechanism such as a turret or a slide mechanism. Note that in this embodiment, the distribution of the illumination light on the pupil plane of the illumination optical system 22 is defined by the reflection film 24a of the prism 24 but can be defined by, for example, arranging, at the pupil position of the illumination optical system 22, a mechanical aperture stop or an aperture stop drawn on a glass surface.

FIG. 3 is a view showing the relationship between the numerical aperture $NA_O$ of the imaging optical system 21 and the distribution (IL1 to IL4) of the illumination light on the pupil plane of the illumination optical system 22. In this embodiment, the distribution of the illumination light on the pupil plane of the illumination optical system 22 is formed from four poles IL1 to IL4. As described above, it is possible to form the light intensity distribution including a plurality of poles (IL1 to IL4) from the one light source 23 by arranging the reflection film 24a functioning as an aperture stop on the pupil plane of the illumination optical system 22. When forming the light intensity distribution including the plurality of poles (peaks) in this way, no plurality of light sources are required, and thus it is possible to simplify or downsize the image capturing unit 6.

FIGS. 4A to 4D are views each showing the grating pattern of the diffraction grating (fine-detection mark) forming the mark and the moire fringes generated by overlaying of the diffracted light components. FIGS. 4A and 4B are views respectively showing diffraction gratings 31 and 32 in which the periods of the grating patterns are slightly different from each other. If the diffraction gratings 31 and 32 are overlaid on each other, the diffracted light components from the respective diffraction gratings generate a pattern (moire fringes) having a period on which the difference between the periods is reflected, as shown in FIG. 4C. The phase of the moire fringes (the positions of the bright and dark portions) changes in accordance with the relative positions of the diffraction gratings. For example, if the diffraction gratings 31 and 32 are relatively slightly shifted in the X direction, the moire fringes shown in FIG. 4C change to those shown in FIG. 4D. Since the phase of the moire fringes changes at a period larger than the magnitudes of the relative positions obtained when the two diffraction gratings actually change, it is possible to measure the relative positions of the two diffraction gratings accurately even if the resolving power of the image capturing unit 6 is low. That is, the mark 4 of the mold M and the mark 5 of the substrate W can be formed by diffraction gratings whose periods are slightly different from each other, and it is possible to measure the relative positions of the mold M and the substrate W by observing the moire fringes.

FIGS. 5A to 5D are views each showing the grating pattern of the diffraction grating forming the mark according to this embodiment. If moire fringes are to be detected with a bright field arrangement (in which illumination is performed from the vertical direction, and diffracted light is detected from the vertical direction), the contrast of the moire fringes degrades due to the influence of the 0th-order light. To solve this problem, in this embodiment, a diffraction grating with a checkerboard pattern shown in FIG. 5A or 5C is used as one of the mark 4 of the mold M and the mark 5 of the substrate W so as to detect the moire fringes with a dark field arrangement in which the mark is illuminated from the oblique direction.

If the combination of the diffraction gratings shown in FIGS. 5A and 5B is illuminated with the illumination light with the light intensity distribution having the poles IL1 to IL4, as shown in FIG. 3, light entering the diffraction grating shown in FIG. 5A is also diffracted in the Y direction. This diffracted light enters the imaging optical system 21 ($NA_O$) while having the X-direction relative positional information, and is detected by the image sensor 25. Therefore, it is possible to measure the relative positions of the two diffraction gratings in the X direction based on an image obtained by the image sensor 25. In the combination of the diffraction gratings shown in FIGS. 5A and 5B, when measuring the relative positions of the diffraction gratings, the illumination light components from the poles IL1 and IL2 are used and the illumination light components from the poles IL3 and IL4 are not used.

Similarly, if the combination of the diffraction gratings shown in FIGS. 5C and 5D is illuminated with illumination light with the light intensity distribution having the poles IL1 to IL4, as shown in FIG. 3, light entering the diffraction grating shown in FIG. 5C is also diffracted in the X direction. This diffracted light enters the imaging optical system 21 ($NA_O$) while having the Y-direction relative positional information, and is detected by the image sensor 25. Therefore, it is possible to measure the relative positions of the two diffraction gratings in the Y direction based on an image obtained by the image sensor 25. In the combination of the diffraction gratings shown in FIGS. 5C and 5D, when measuring the relative positions, the illumination light components from the poles IL3 and IL4 are used and the illumination light components from the poles IL1 and IL2 are not used.

As described above, the image capturing unit 6 according to this embodiment can capture an image of the diffraction gratings shown in FIGS. 5A to 5D using the illumination light with the light intensity distribution shown in FIG. 3, thereby measuring the relative positions in the two directions (X and Y directions) from a thus obtained image. That is, it is possible to measure the relative positions in the two directions (X and Y directions) simultaneously and accurately by arranging, in the same field of view of the image capturing unit 6, the pair of the diffraction gratings shown in FIGS. 5A and 5B and the pair of the diffraction gratings shown in FIGS. 5C and 5D, and capturing an image of the pairs.

Imprint Process

Figure 6A:
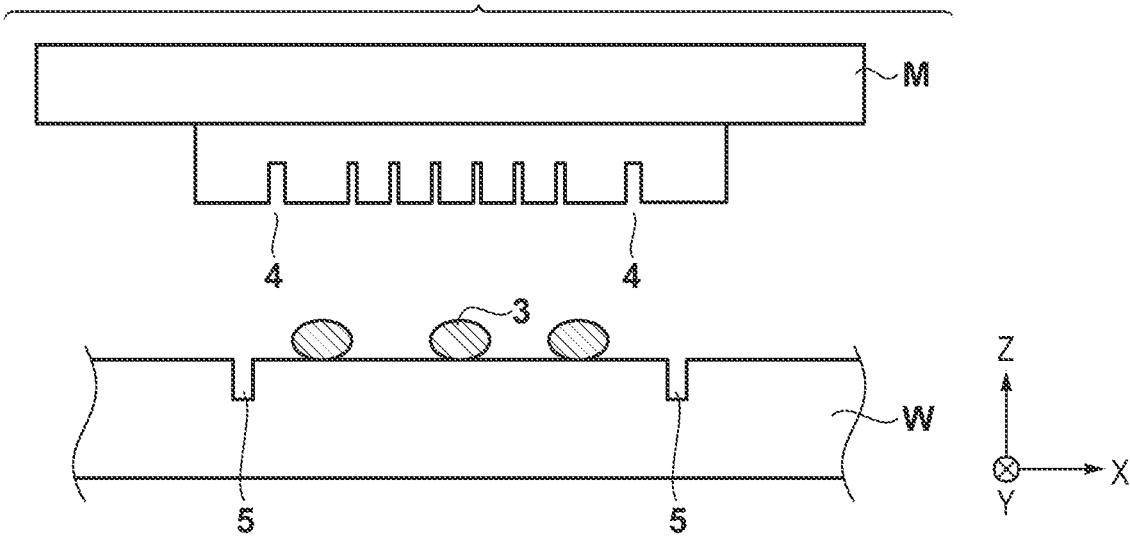
FIGS. 6A to 6C are views for explaining an imprint process.
Figure 6B:
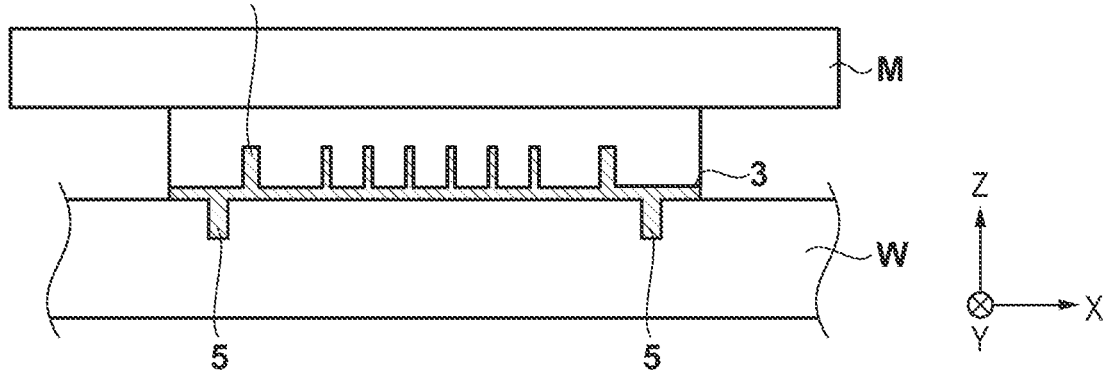
Figure 6C:
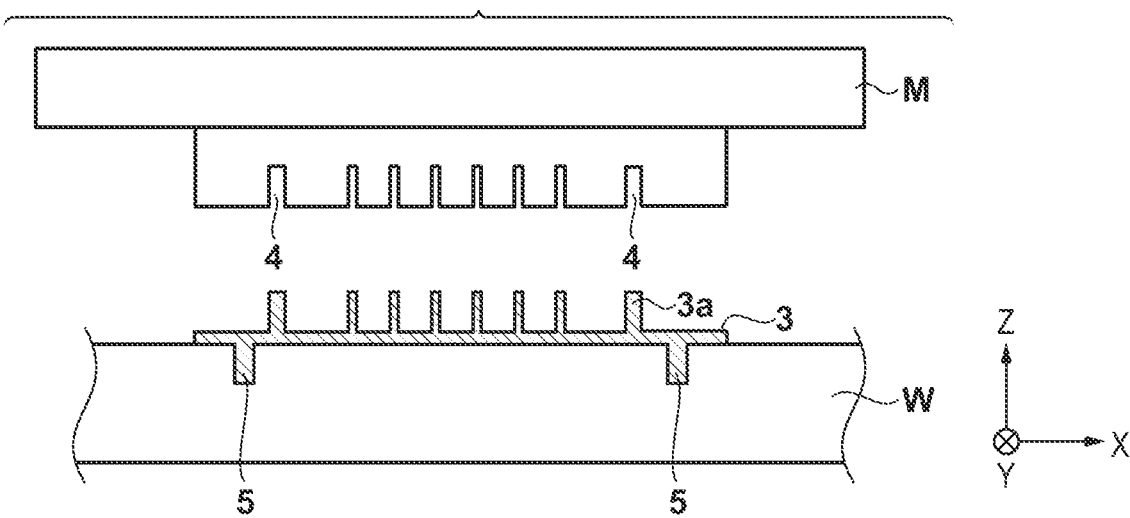

An imprint process by the imprint apparatus 100 will be described next. FIGS. 6A to 6C are views for explaining the imprint process, and show the mold M and the substrate W. As shown in FIG. 6A, in the imprint process, the substrate W supplied with an imprint material 3 as droplets is arranged below the mold M. The supply of the imprint material 3 onto the substrate W may be performed for each shot region, or may be performed over the entire surface of the substrate W in advance. As shown in FIG. 6B, the mold M is brought into contact with the imprint material 3 on the substrate by narrowing the interval between the mold M and the substrate W, thereby filling the uneven pattern of the mold M with the imprint material. In the steps (in the pattern formation) shown in FIGS. 6A and 6B, an alignment process of the mold M and the substrate W is performed based on images obtained by capturing the marks 4 of the mold M and the marks 5 of the substrate W by the image capturing units 6. After the end of the alignment process, light (the ultraviolet light 7) is emitted to the imprint material 3 on the substrate via the mold M to cure the imprint material 3, and then the mold M is separated (released) from the cured imprint material 3, as shown in FIG. 6C. The marks 4 of the mold M are transferred to the imprint material 3 on the substrate on which the pattern has been formed, as represented as transfer marks 3a in FIG. 6C.

Arrangement of Mark

A mark element used to measure the relative positions of the mold M and the substrate W generally has the contrary relationship between the measurement accuracy (the resolution of the relative positions) and the measurement range (the measurable area of the relative positions). For example, as described above, the mark element (fine-detection mark) formed by the diffraction grating can accurately measure the relative positions of the mold M and the substrate W within one period of the moire fringes, and thus the measurement accuracy is high. On the other hand, it is impossible to measure the shift for each period (for a period) of the moire fringes, and thus the measurement range is narrow. Therefore, each of the mark 4 of the mold M and the mark 5 of the substrate W is provided with, as a mark element, a rough-detection mark whose measurement accuracy is low and whose measurement range is wide in addition to the fine-detection mark whose measurement accuracy is high and whose measurement range is narrow. By making these mark elements (fine-detection mark and rough-detection mark) fall within the same field of view of the image capturing unit 6 and detecting them, both the high measurement accuracy and the wide measurement range can be achieved. That is, it is possible to specify the position of the fine-detection mark using the detection result of the rough-detection mark, and adjust the relative positions of the mold M and the substrate W so that the fine-detection mark falls within a desired measurement range.

Figure 7A:
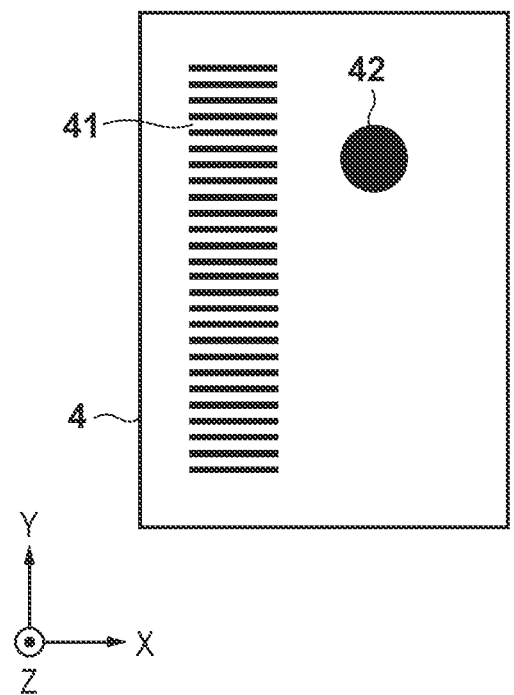
FIGS. 7A to 7D are views respectively showing examples of the conventional arrangements of a mark of a mold M and that of a substrate W.
Figure 7B:
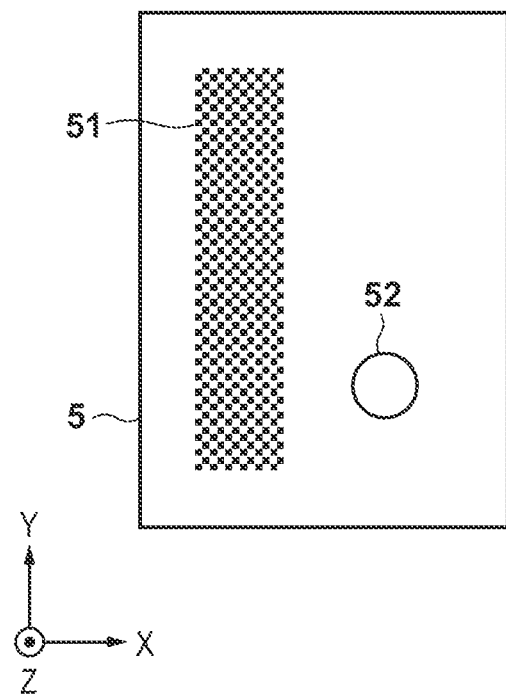

FIGS. 7A to 7D are views respectively showing examples of the conventional arrangements of the mark 4 of the mold M and the mark 5 of the substrate W. FIG. 7A shows an example of the conventional arrangement of the mark 4 of the mold M, in which the mark 4 can include a fine-detection mark 41 formed by a diffraction grating and a rough-detection mark 42 for specifying the position of the fine-detection mark to fall within the measurement range. FIG. 7B shows an example of the conventional arrangement of the mark 5 of the substrate W, in which the mark 5 can include a fine-detection mark 51 formed by a diffraction grating with a checkerboard pattern and a rough-detection mark 52 for specifying the position of the fine-detection mark. It is possible to generate moire fringes by overlaying the fine-detection mark 41 in the mark 4 of the mold M and the fine-detection mark 51 in the mark 5 of the substrate W.

Figure 7C:
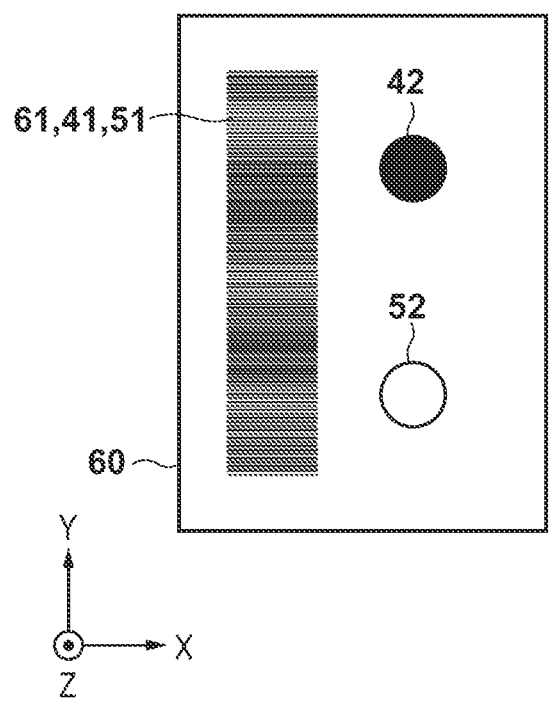

FIG. 7C shows an image 60 obtained by capturing, by the image capturing unit 6, a state in which the mark 4 shown in FIG. 7A and the mark 5 shown in FIG. 7B overlap each other in the alignment process in the imprint process. The control unit 10 performs rough alignment (that is, the positions of the fine-detection marks 41 and 51 are made to fall within the measurement range) based on the relative positions of the rough-detection marks 42 and 52 in the image (image 60), and also specifies the positions (periods) of the fine-detection marks 41 and 51. This makes it possible to obtain the relative positions of the mold M and the substrate W based on moire fringes 61 generated by the fine-detection marks 41 and 51.

The mold M is manufactured by a material such as quartz that passes the ultraviolet light 7, and has a small refractive index difference with respect to the imprint material supplied onto the substrate. Thus, if the mold M and the imprint material are brought into contact with each other and the marks 4, formed as concave portions, of the mold M are filled with the imprint material, it becomes difficult to detect the marks 4 of the mold M by the image capturing units 6. To cope with this, each mark 4 (fine-detection mark 41 and rough-detection mark 42) of the mold M has a metal film formed by vapor deposition or the like, and is configured to be detectable by the image capturing unit 6 even in the state in which the mold M and the imprint material are in contact with each other.

Furthermore, in the image 60 obtained by the image capturing unit 6, the signal strength of the mark 4 of the mold M and that of the mark 5 of the substrate W are preferably close to each other in order to perform stable mark measurement. To achieve this, the mark 4 of the mold M can be adjusted in terms of the size (dimensions) of the mark and the thickness of the metal film so that the signal strength in the image obtained by the image capturing unit 6 becomes close to the signal strength of the mark 5 of the substrate W.

Overlay Inspection

Since the imprint apparatus 100 employs the die-by-die alignment method, the overlay accuracy of the pattern already formed in the substrate W and the pattern formed in the imprint material on the substrate may be different for each shot region. Therefore, it is desirable for the imprint apparatus 100 to inspect the overlay accuracy in the apparatus so as to quickly reflect the inspection result of the overlay accuracy on a subsequent imprint process. At this time, in the alignment process and the overlay inspection, it is preferable to capture an image of the substrate W under similar image capturing conditions such as the magnification of each image capturing unit 6.

Figure 7D:
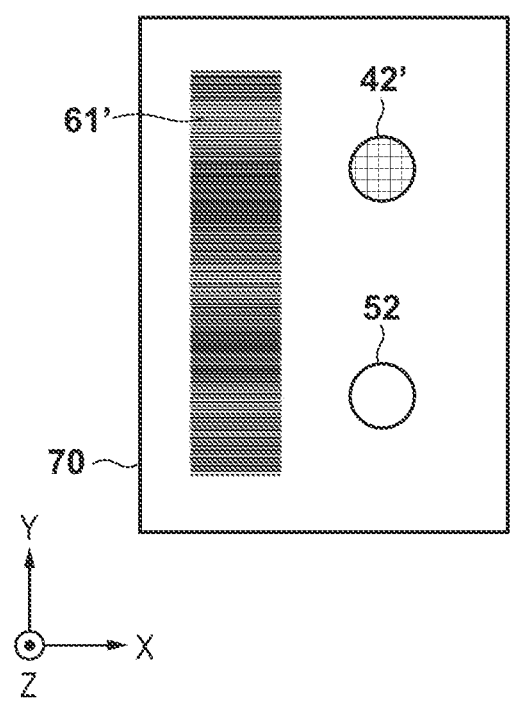

For example, overlay inspection is performed based on an image 70 obtained by capturing the mark of the substrate W and the mark formed (transferred) in the imprint material on the substrate by the image capturing unit 6, as shown in FIG. 7D. In the image 70 shown in FIG. 7D, a rough-detection mark 42' indicates a mark formed in the imprint material on the substrate by transferring the rough-detection mark 42 of the mold M to the imprint material. Furthermore, moire fringes 61' indicate moire fringes formed by transferring the fine-detection mark 41 of the mold M to the imprint material on the fine-detection mark 51 of the substrate W.

In the image 70 obtained by the image capturing unit 6 in the overlay inspection, the signal strength of the rough-detection mark 42' formed in the imprint material is much smaller than that of the rough-detection mark 52 of the substrate W. Especially, as described above, if the size of the mark is adjusted so that the signal strengths are equal to each other in the imprint process, the material of the rough-detection mark changes, and thus the difference is conspicuous. Therefore, in the overlay inspection, if a rough-detection mark group to be used to specify the positions of the fine-detection marks is selected under the same conditions as those for the alignment process, it may be impossible to find the rough-detection mark group or the rough-detection mark may be erroneously detected.

To solve this problem, the control unit 10 according to this embodiment changes (differentiates) the rough-detection mark group to be used to specify the positions of the fine-detection marks in the image obtained by the image capturing unit 6 between the alignment process and the overlay inspection. More specifically, in the alignment process, a rough-detection mark group arranged in the first positional relationship is selected in the image obtained by the image capturing unit 6, and the positions of the fine-detection marks are specified based on the position of the selected rough-detection mark group. On the other hand, in the overlay inspection, a rough-detection mark group arranged in the second positional relationship different from the first positional relationship is selected, and the positions of the fine-detection marks are specified based on the position of the selected rough-detection mark group. Details of this embodiment will be described below.

Example 1

Example 1 of this embodiment will be described. FIGS. 8A and 8B are views respectively showing examples of the arrangements of a mark 4 of a mold M and a mark 5 of a substrate W according to Example 1 of this embodiment. FIG. 8A shows an example of the arrangement of the mark 4 of the mold M. FIG. 8B shows an example of the arrangement of the mark 5 of the substrate W. FIGS. 9A and 9B are views each showing an image obtained by an image capturing unit 6. FIG. 9A shows an image 60 obtained by the image capturing unit 6 in an alignment process. FIG. 9B shows an image 70 obtained by the image capturing unit 6 in overlay inspection. Note that "the image obtained by the image capturing unit 6" indicates the field of view of the image capturing unit 6, that is, the imagable region (observable region) of the image sensor 25.

Figure 10A:
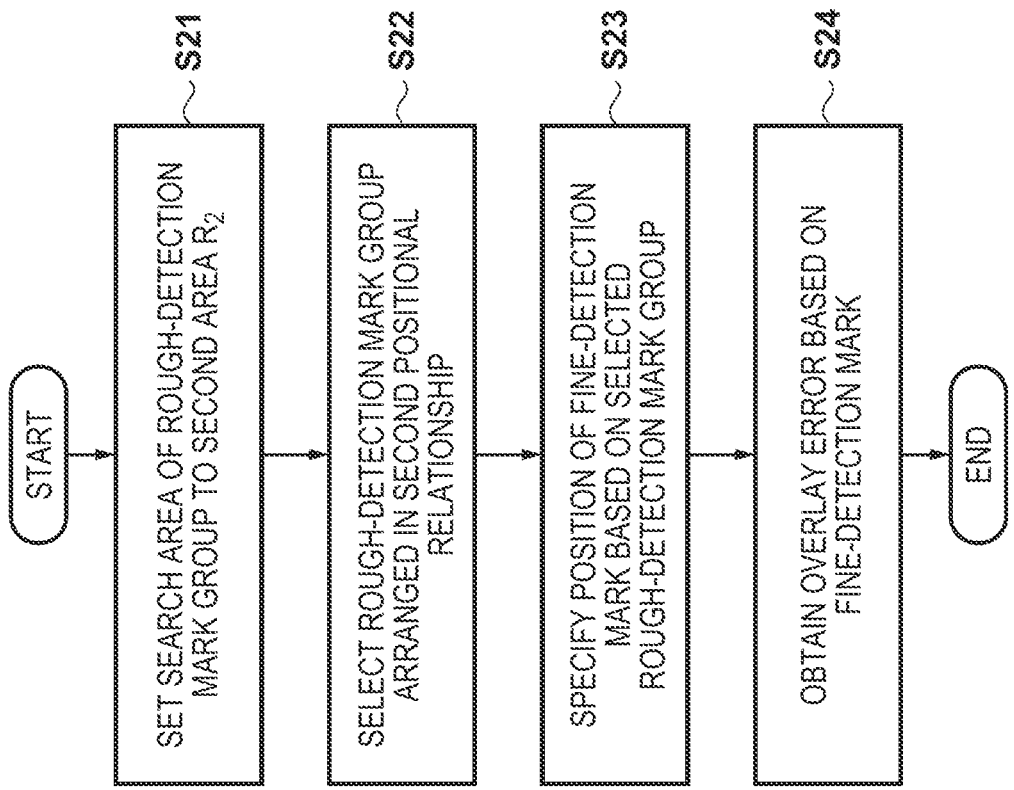
FIGS. 10A and 10B are flowcharts respectively illustrating an alignment process and overlay inspection.

The alignment process according to Example 1 will be described with reference to FIG. 10A. FIG. 10A is a flowchart illustrating the alignment process. In step S11, a control unit 10 sets, as a first area $R_1$, the search area of a rough-detection mark group to be used to specify the positions of fine-detection marks in the image 60 obtained by the image capturing unit 6, as shown in FIG. 9A. The search area is an area (to also be referred to as a measurement area) in the image, where the search process of the rough-detection mark group is performed. In step S12, the control unit 10 selects (searches for) a rough-detection mark group arranged in the first positional relationship within the search area set as the first area $R_1$. Information of the first positional relationship is preset by the user via a user interface provided in the imprint apparatus 100. In this embodiment, the positional relationship between two rough-detection marks arrayed in the Y direction is set as the first positional relationship. In the example shown in FIG. 9A, a rough-detection mark 42 of the mold M and a rough-detection mark 52a of the substrate W are selected as a rough-detection mark group arranged in the first positional relationship. In step S13, the control unit 10 aligns the mold M and the substrate W based on the selected rough-detection mark group. In step S14, the control unit 10 specifies the position of the fine-detection mark based on the selected rough-detection mark group. In step S15, the control unit 10 aligns the mold M and the substrate W based on moire fringes 61 in the fine-detection mark.

Figure 10B:
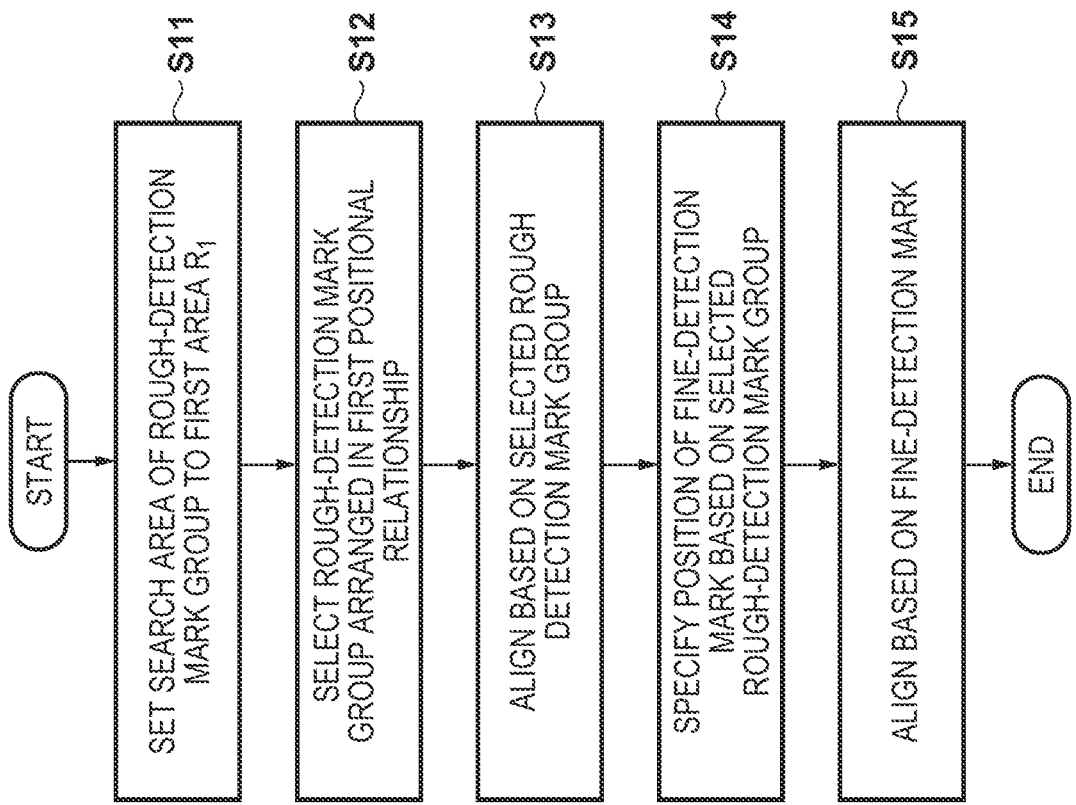

Overlay inspection according to Example 1 will be described next with reference to FIG. 10B. FIG. 10B is a flowchart illustrating the overlay inspection. In step S21, the control unit 10 sets, as a second area $R_2$, the search area of a rough-detection mark group to be used to specify the positions of fine-detection marks in the image 70 obtained by the image capturing unit 6, as shown in FIG. 9B. An area wider than the first area $R_1$ is set as the second area $R_2$ so that the number of rough-detection marks included in the search area is larger than that in the alignment process.

In step S22, the control unit 10 selects (searches for) a rough-detection mark group arranged in the second positional relationship within the search area set as the second area $R_2$. The image 70 used in the overlay inspection includes a rough-detection mark 42' formed in the imprint material, and the rough-detection mark 42' has a very small signal strength in the image 70. Therefore, it is not preferable to select, as part of the rough-detection mark group for specifying the positions of the fine-detection marks, the rough-detection mark 42' formed in the imprint material. Thus, in Example 1, the positional relationship among the rough-detection mark 52a and rough-detection marks 52b and 52c of the substrate W is preset as the second positional relationship by the user via the user interface so that the rough-detection mark 42' formed in the imprint material is not selected. This allows the control unit 10 to select, as a rough-detection mark group for specifying the fine-detection marks, the rough-detection marks 52a to 52c arranged in the second positional relationship in the image 70. In step S23, the control unit 10 specifies the positions of the fine-detection marks based on the selected rough-detection mark group. In step S24, the control unit 10 obtains (calculates) an overlay error between the mold M and the substrate W based on moire fringes 61' in the fine-detection marks.

The second positional relationship is set so that the rough-detection mark group selected in the alignment process and that selected in the overlay inspection commonly include at least one rough-detection mark of the substrate W. This makes it possible to refer (to use), in the overlay inspection, the information used to specify the positions of the fine-detection marks based on the position of the rough-detection mark group in the alignment process. That is, the accuracies of specifying the positions of the fine-detection marks in the alignment process and the overlay inspection can be made close to each other (made to match each other). In the example shown in FIG. 9B, in the alignment process and the overlay inspection, the rough-detection mark 52a of the substrate W can be commonly selected.

When performing measurement in the first area $R_1$, a pattern having the positional relationship between the marks 42 and 52a as rough-detection marks is searched for. Thus, the positional relationship between the marks 52b and 52c used in the second area $R_2$ is preferably not the positional relationship between the marks 42 and 52. The number of marks used in the second area $R_2$ may be changed.

As described above, in the alignment process, in the image 60 obtained by image capturing unit 6, the positions of the fine-detection marks are specified based on the rough-detection mark group arranged in the first positional relationship. On the other hand, in the overlay inspection, in the image 70 obtained by the image capturing unit 6, the positions of the fine-detection marks are specified based on the rough-detection mark group arranged in the second positional relationship different from the first positional relationship. This makes it possible to perform image capturing by the image capturing unit 6 under the same image capturing conditions in the alignment process and the overlay inspection. In addition, it is possible to avoid selecting the rough-detection mark formed in the imprint material as part of the rough-detection mark group to be used to specify the positions of the fine-detection marks, thereby performing the overlay inspection accurately.

Example 2

Example 2 of this embodiment will be described. In Example 2, in overlay inspection, a rough-detection mark group to be used to specify the positions of fine-detection marks includes part of a pattern already formed in a substrate W. This makes it possible to accurately specify the positions of the fine-detection marks without newly providing, in the substrate W, a rough-detection mark to be used only in the overlay inspection.

Figure 12B:
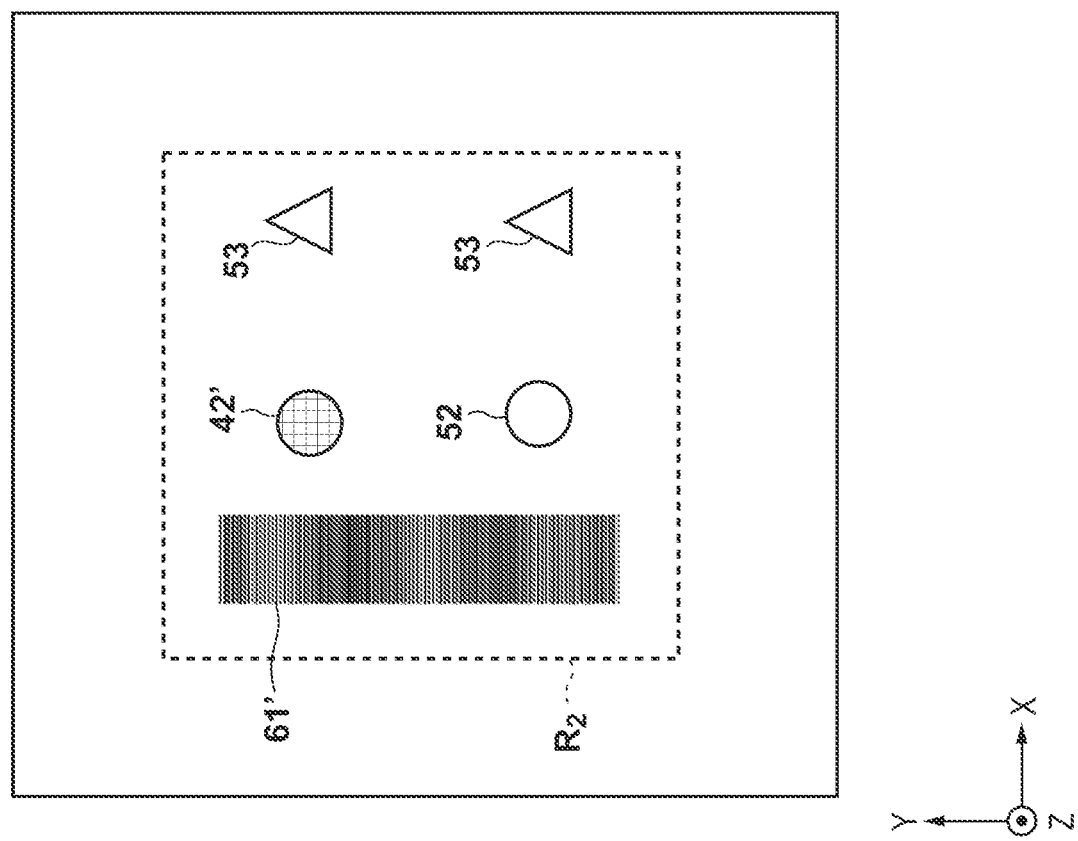
FIGS. 12A and 12B are views each showing an image obtained by an image capturing unit according to Example 2.
Figure 12A:
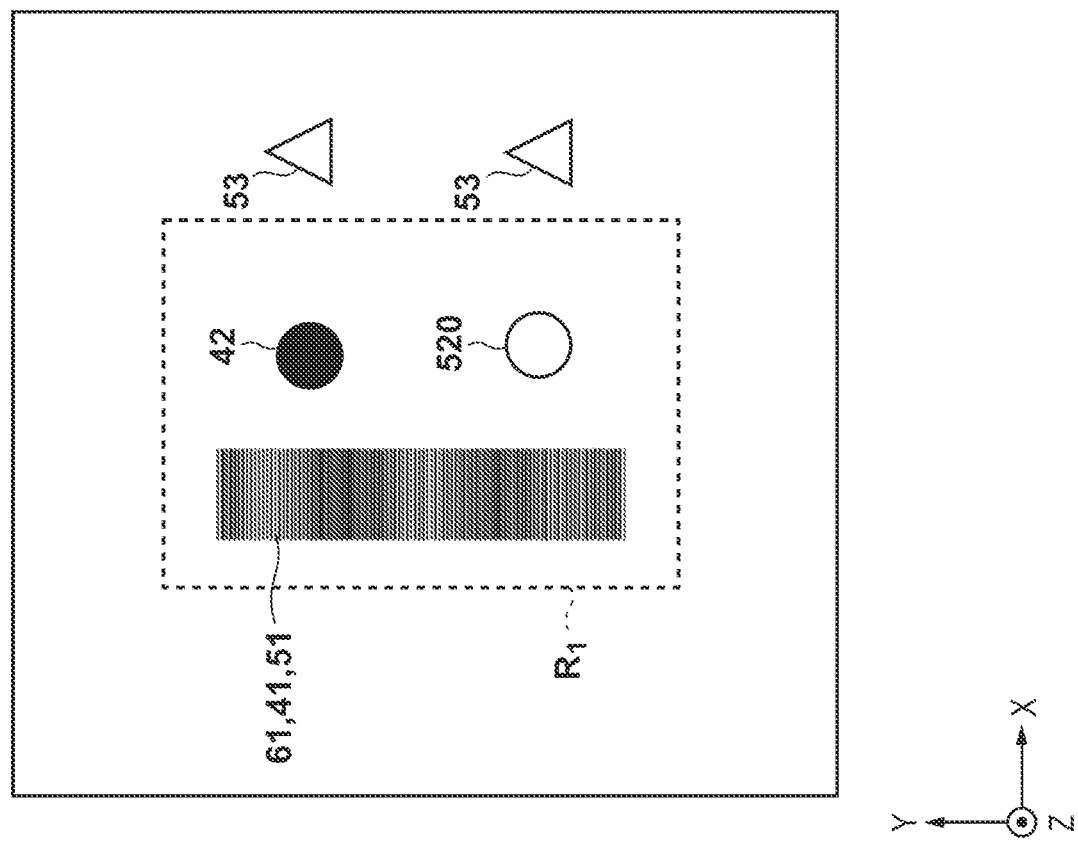

FIGS. 11A and 11B are views respectively showing examples of the arrangements of a mark 4 of a mold M and a mark 5 of the substrate W according to Example 2 of this embodiment. FIG. 11A shows an example of the arrangement of the mark 4 of the mold M. FIG. 11B shows an example of the arrangement of the mark 5 of the substrate W. FIG. 11B shows parts 53 of a pattern already formed in the substrate W in addition to the mark 5. FIGS. 12A and 12B are views each showing an image obtained by an image capturing unit 6. FIG. 12A shows an image 60 obtained by the image capturing unit 6 in an alignment process. FIG. 12B shows an image 70 obtained by the image capturing unit 6 in overlay inspection.

The alignment process according to Example 2 is performed in accordance with the flowchart shown in FIG. 10A, similar to Example 1. More specifically, a control unit 10 selects a rough-detection mark group (a rough-detection mark 42 of the mold M and a rough-detection mark 52 of the substrate W) arranged in the first positional relationship within a search area set as a first area $R_1$, as shown in FIG. 12A. Then, the positions of fine-detection marks are specified based on the position of the selected rough-detection mark group, and the mold M and the substrate W are aligned based on moire fringes 61 by the fine-detection marks.

The overlay inspection according to Example 2 is also performed in accordance with the flowchart shown in FIG. 10B, similar to Example 1. More specifically, the control unit 10 selects a rough-detection mark group arranged in the second positional relationship within a search area set as a second area $R_2$, as shown in FIG. 12B. However, in Example 2, the second positional relationship can be set to use, as part of the rough-detection mark group for specifying the positions of the fine-detection marks, the parts 53 of the pattern already formed in the substrate W. Then, the positions of the fine-detection marks are specified based on the position of the selected rough-detection mark group (the rough-detection mark 42 of the mold M and the parts 53 of the pattern of the substrate W), and an overlay error between the mold M and the substrate W is obtained based on moire fringes 61' in the fine-detection marks.

As described above, it is possible to obtain the same effect as in Example 1 even if the parts of the pattern already formed in the substrate are used as part of the rough-detection mark group to be used to specify the positions of the fine-detection marks in the overlay inspection.

Second Embodiment

An imprint apparatus according to the second embodiment of the present invention will be described. The imprint apparatus according to the second embodiment has a similar arrangement to that of the imprint apparatus 100 according to the first embodiment. The imprint apparatus according to the second embodiment performs an alignment process based on the first image obtained by capturing, by an image capturing unit 6, the first mark provided on a substrate and a mark of a mold M. In addition, the imprint apparatus performs overlay inspection based on the second image obtained by capturing, by the image capturing unit 6 without intervention of the mold M, the second mark provided at a position, different from the position of the first mark, on the substrate.

Figure 13A:
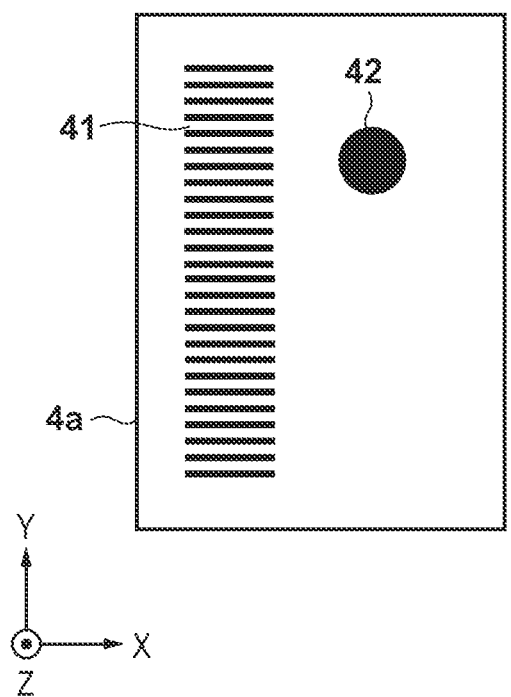
FIGS. 13A to 13D are views respectively showing examples of the arrangements of marks of a mold M and those of a substrate W according to the second embodiment.
Figure 13B:
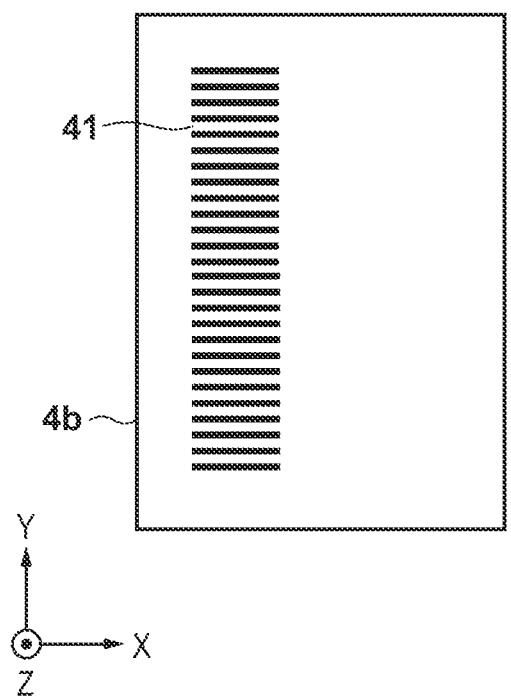
Figure 13C:
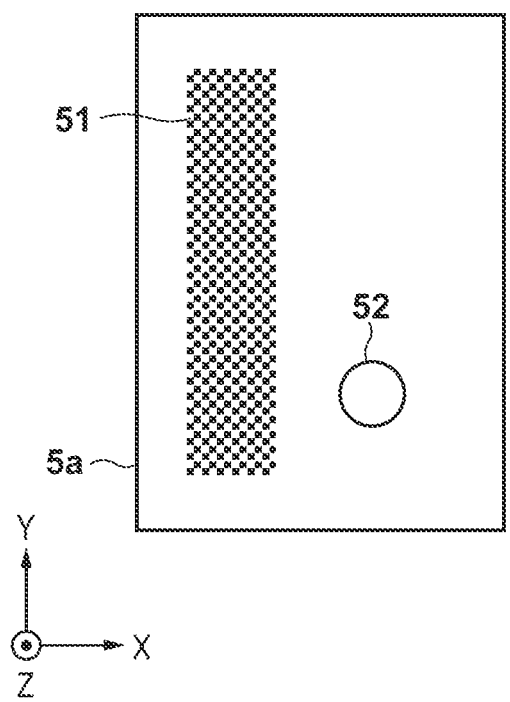
Figure 13D:
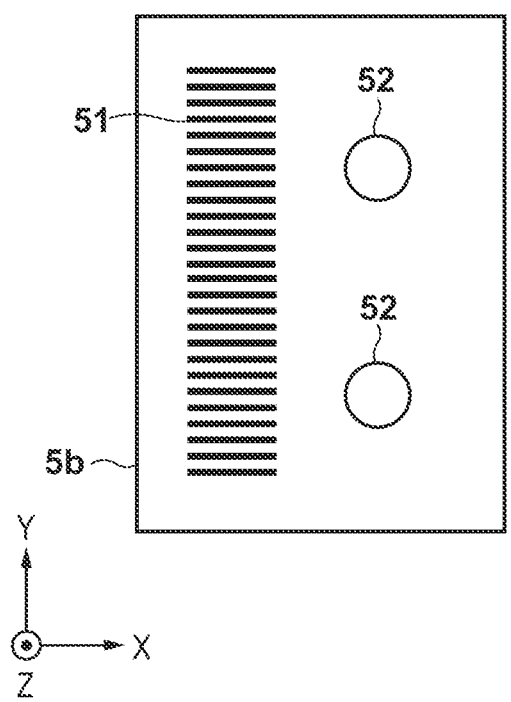
Figure 14A:
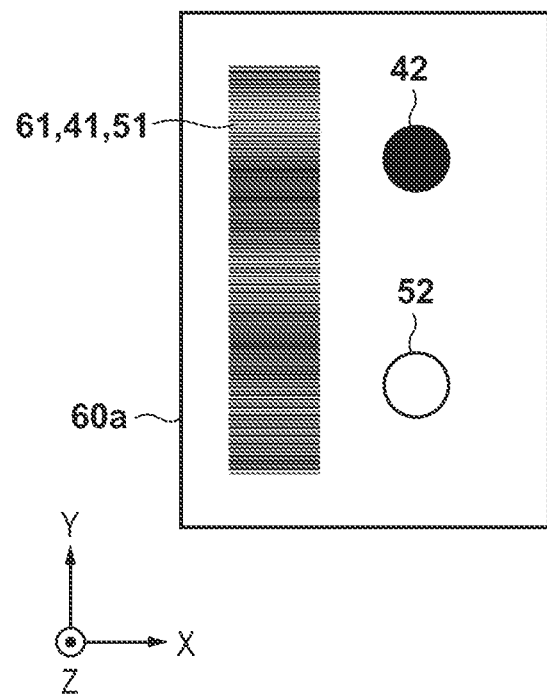
FIGS. 14A to 14D are views each showing an image obtained by an image capturing unit according to the second embodiment.
Figure 14B:
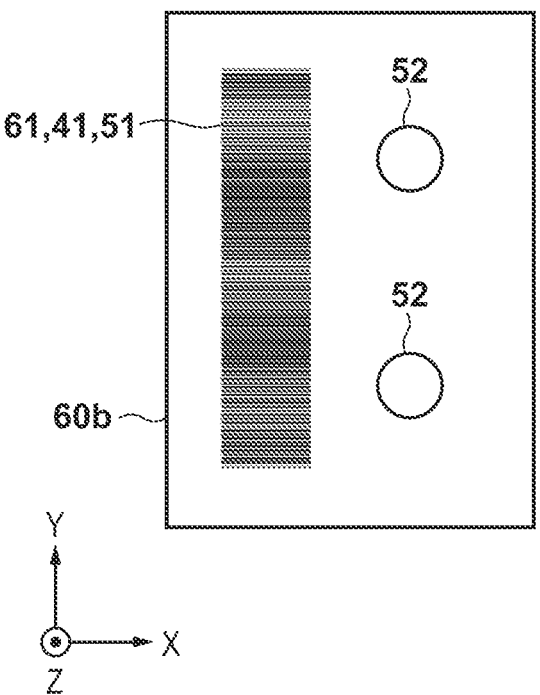
Figure 14C:
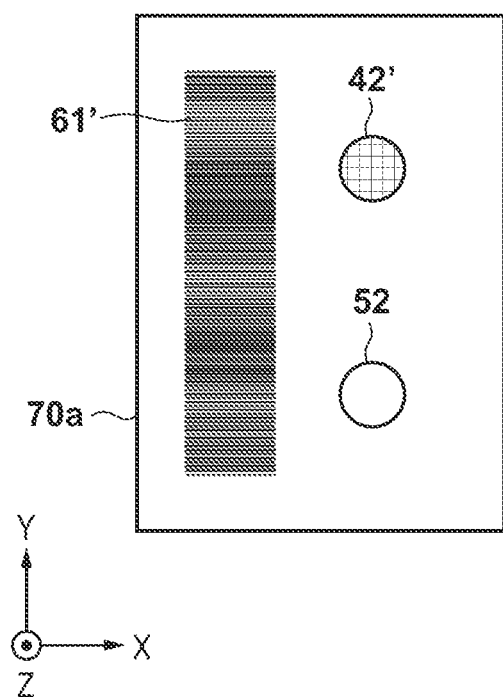
Figure 14D:
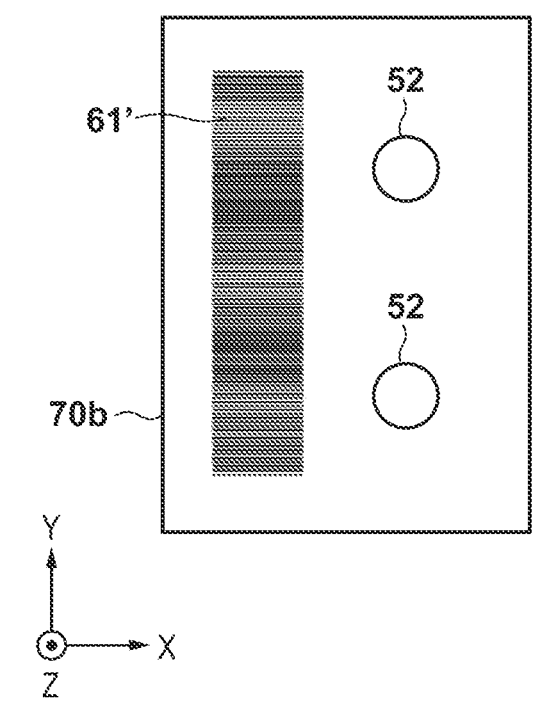

FIG. 13A is a view showing a first mark 4a and a second mark 4b provided at different positions on the mold M. FIG. 13B is a view showing a first mark 5a and a second mark 5b provided at different positions on a substrate W. FIGS. 14A and 14B are views each showing an image 60 obtained by overlaying the mark (FIG. 13A) of the mold M and the mark (FIG. 13B) of the substrate W and capturing them by the image capturing unit 6 in the alignment process. An image 60a shown in FIG. 14A is an image obtained by overlaying the first mark 4a of the mold M and the first mark 5a of the substrate W and capturing them. An image 60b shown in FIG. 14B is an image obtained by overlaying the second mark 4b of the mold M and the second mark 5b of the substrate W and capturing them. FIGS. 14C and 14D are views each showing an image obtained by capturing, by the image capturing unit 6 without intervention of the mold M, the mark (FIG. 13A) of the substrate W and the mark formed (transferred) in the imprint material on the substrate in the overlay inspection. An image 70a shown in FIG. 14C is an image obtained by capturing the first mark 5a of the substrate W. An image 70b shown in FIG. 14D is an image obtained by capturing the second mark 5b of the substrate W.

The alignment process is performed based on the image 60a (first image) obtained by overlaying the first mark 4a of the mold M and the first mark 5a of the substrate W and capturing them by the image capturing unit 6. The first mark 4a of the mold M is formed to include a fine-detection mark 41 (diffraction grating) and a rough-detection mark 42, as shown in FIG. 13A. Furthermore, the first mark 5a of the substrate W is formed to include a fine-detection mark 51 (diffraction grating) and a rough-detection mark 52, as shown in FIG. 13B. Therefore, by overlaying the first mark 4a of the mold M and the first mark 5a of the substrate W and capturing them by the image capturing unit 6, the image 60a (first image) shown in FIG. 14A is obtained. A control unit 10 can specify the positions (periods) of the fine-detection marks based on the position of the rough-detection mark group (42 and 52) in the first image 60a, and obtain the relative positions of the mold M and the substrate W based on moire fringes 61 generated by the fine-detection marks.

On the other hand, in the overlay inspection, the signal strength of a rough-detection mark 42' transferred to the imprint material on the substrate is much smaller than that of the rough-detection mark 52 of the substrate W, as indicated in the image 70a shown in FIG. 14C. Therefore, the overlay inspection of this embodiment is performed based on the image shown in FIG. 14D (the image 70b (second image) obtained by capturing the second mark 5b of the substrate W). The second mark 5b of the substrate W is formed so that the mark arrangement of the second image 70b is the same as that of the image 60a. More specifically, the second mark 4b of the mold M is formed to include only the fine-detection mark 41 without including any rough-detection mark, as shown in FIG. 13A. Furthermore, the second mark 5b of the substrate W is formed to include a plurality of rough-detection marks 52 so as to compensate for rough-detection marks in the second mark 4b of the mold M.

With this arrangement, in the first image 60a used in the alignment process and the second image 70b used in the overlay inspection, it is possible to obtain similar signal strengths in the same mark arrangement. Therefore, it is possible to perform the alignment process and the overlay inspection without changing the image capturing conditions of the image capturing unit 6 and the rough-detection mark search conditions.

Third Embodiment

An imprint apparatus according to the third embodiment of the present invention will be described. The imprint apparatus according to the third embodiment has the same arrangement as that of the imprint apparatus 100 according to the first embodiment. The imprint apparatus according to the third embodiment performs an alignment process based on the first image obtained by capturing, by an image capturing unit 6, the first mark provided on a substrate and a mark of a mold M.

At this time, the size of the first mark may vary due to a manufacturing error of the substrate, and the signal strength of the first mark may change due to the relationship of a multilayer film arranged on the substrate. Especially, since the structure and material of a rough-detection mark is different between a mark provided on the substrate and that of the mold M, the signal strength difference may change. If the change falls within an allowable range, measurement can be performed intact. If, however, the signal strength changes by exceeding a measurable range, the rough-detection mark cannot be measured, and it may thus be impossible to perform alignment measurement.

The mark arrangement explained in each of the above-described embodiments can cope with this problem. For example, the case of the mark arrangement described with reference to FIG. 9 will be explained. As shown in FIG. 9A, in mark detection during normal imprinting, alignment measurement is performed using a fine-detection mark 61, a rough-detection mark 42 of the mold M, and a rough-detection mark 52a of a substrate W. As described above, since in alignment measurement, it is necessary to quickly perform a search process from an obtained image 60, a first area $R_1$ as a detection area is made as small as possible. At this time, if the rough-detection mark 52a includes a defect, and cannot thus be detected, alignment measurement cannot be performed.

If a defect is generated in the rough-detection mark 52a, rough-detection marks 52b and 52c of the substrate W are used at the time of alignment measurement. If the rough-detection mark 52a cannot be used, a detection area is set to a second area $R_2$, as shown in FIG. 9B. The detection area is widened in this way to include the rough-detection marks 52b and 52c. The mold M and the substrate W are aligned by obtaining the relative positions of the rough-detection mark 52b (52c) and the rough-detection marks 42. This makes it possible to perform alignment measurement even if the rough-detection mark 52a includes a defect.

Furthermore, if the signal strength of the rough-detection mark 52a is largely different from that of the rough-detection mark 42 or the fine-detection mark 61, even if light control is performed, it may be impossible to obtain signal strengths suitable among the fine-detection mark 61 and the rough-detection mark 42 of the mold M, and the rough-detection mark 52a of the substrate W.

To cope with this, as shown in FIGS. 15A and 15B, for example, a rough-detection mark 52d of the substrate W can be made smaller than the rough-detection mark 52a, or a rough-detection mark 52e of the substrate W can be made larger than the rough-detection mark 52a. FIGS. 15A and 15B respectively show a state at the time of mark detection during imprinting. As shown in FIGS. 15A and 15B, by forming rough-detection marks of various sizes of the substrate W, it is possible to adjust the signal strength by selecting an appropriate rough-detection mark (52d or 52e) when the rough-detection mark 52a is not suitable for alignment measurement. As shown in FIGS. 15A and 15B, it is possible to adjust the intensity (signal strength) of light from the rough-detection mark of the substrate W by changing the shape of the second mark provided at a position, different from that of the first mark, on the substrate.

The added mark (second mark) is not limited to the rough-detection mark of the substrate W, and may be the rough-detection mark of the mold M. In this case, the rough-detection mark of the mold M, which has the signal strength close to that of the rough-detection mark 52a of the substrate W, is selected. Furthermore, some rough-detection marks of the substrate W and some rough-detection marks of the mold M may be arranged and a combination of rough-detection marks from which optimum signal strengths are obtained may be selected. The signal strength may be adjusted by using the degree of segmentation, a shape, or the like, instead of the size of the mark.

As described in the second embodiment, it is possible to perform similar measurement by acquiring, in advance, even part of a pattern formed on the substrate and measuring the signal strength ratio.

With this arrangement, even if the rough-detection mark 52a of the substrate W includes a defect in an alignment process, alignment measurement can be continued without stopping due to an error. For example, it is possible to avoid an error when performing alignment measurement for a large number of substrates at the time of, for example, actual device manufacturing.

<Embodiment of Method of Manufacturing Article>

A method of manufacturing an article according to an embodiment of the present invention is suitable for manufacturing an article, for example, a microdevice such as a semiconductor device or an element having a microstructure. The method of manufacturing the article according to this embodiment includes a step of forming a pattern on an imprint material supplied (dispensed) onto a substrate using the above-described imprint apparatus (imprint method), and a step of processing the substrate on which the pattern has been formed in the preceding step. This manufacturing method further includes other known steps (oxidation, deposition, vapor deposition, doping, planarization, etching, resist separation, dicing, bonding, packaging, and the like). The method of manufacturing the article according to this embodiment is advantageous in at least one of the performance, the quality, the productivity, and the production cost of the article, as compared to a conventional method.

The pattern of a cured product formed using the imprint apparatus is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, a SRAM, a flash memory, and a MRAM and semiconductor elements such as an LSI, a CCD, an image sensor, and an FPGA. Examples of the mold are molds for imprint.

The pattern of the cured product is directly used as the constituent member of at least some of the above-described articles or used temporarily as a resist mask. After etching or ion implantation is performed in the substrate processing step, the resist mask is removed.

Figure 16A:
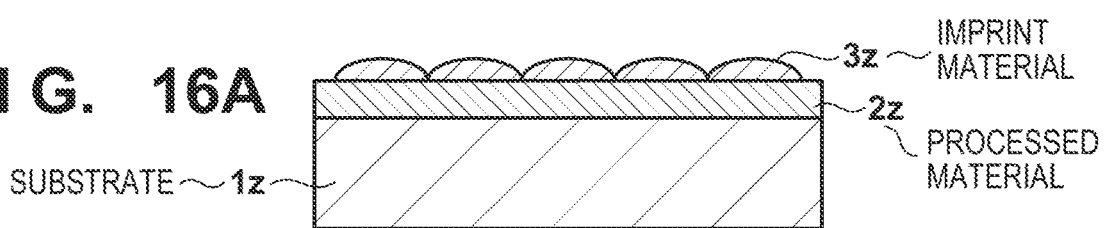
FIGS. 16A to 16F are views showing a method of manufacturing an article.

A detailed method of manufacturing an article will be described next. As shown in FIG. 16A, a substrate 1z such as a silicon wafer with a processed material 2z such as an insulator formed on the surface is prepared. Next, an imprint material 3z is applied to the surface of the processed material 2z by an inkjet method or the like. A state in which the imprint material 3z is applied as a plurality of droplets onto the substrate is shown here.

Figure 16B:
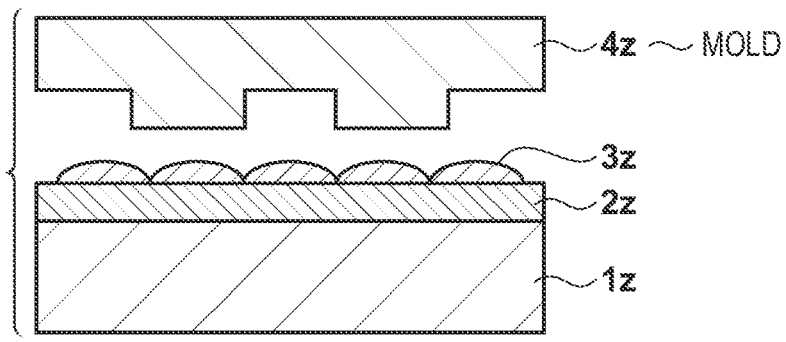
Figure 16C:
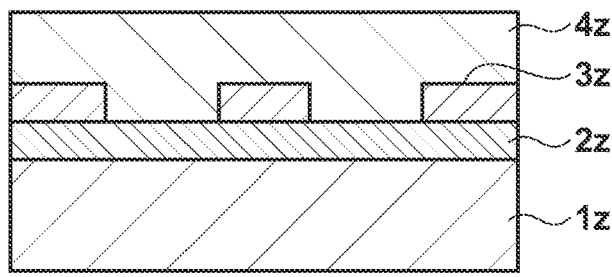

As shown in FIG. 16B, a side of a mold 4z for imprint with an uneven pattern is directed to and caused to face the imprint material 3z on the substrate. As shown in FIG. 16C, the substrate 1z to which the imprint material 3z is applied is brought into contact with the mold 4z, and a pressure is applied. The gap between the mold 4z and the processed material 2z is filled with the imprint material 3z. In this state, when the imprint material 3z is irradiated with energy for curing through the mold 4z, the imprint material 3z is cured.

Figure 16D:
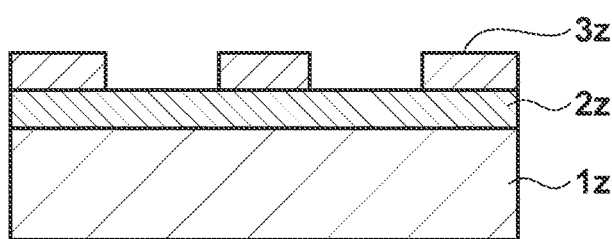

As shown in FIG. 16D, after the imprint material 3z is cured, the mold 4z is separated from the substrate 1z. Then, the pattern of the cured product of the imprint material 3z is formed on the substrate 1z. In the pattern of the cured product, the concave portion of the mold corresponds to the convex portion of the cured product, and the concave portion of the mold corresponds to the convex portion of the cured product. That is, the uneven pattern of the mold 4z is transferred to the imprint material 3z.

Figure 16E:
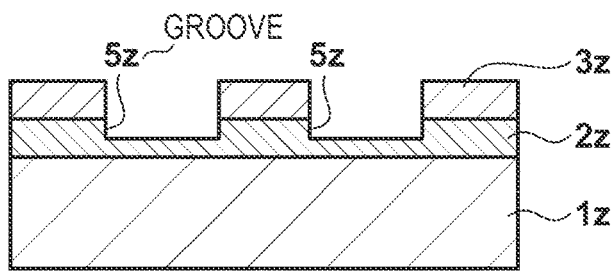
Figure 16F:
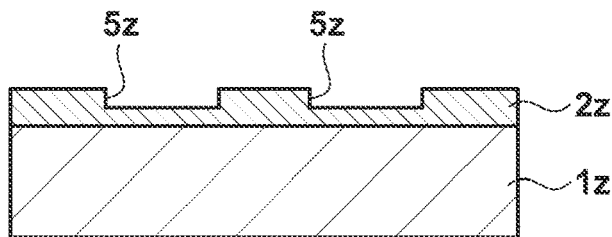

As shown in FIG. 16E, when etching is performed using the pattern of the cured product as an etching resistant mask, a portion of the surface of the processed material 2z where the cured product does not exist or remains thin is removed to form a groove 5z. As shown in FIG. 16F, when the pattern of the cured product is removed, an article with the grooves 5z formed in the surface of the processed material 2z can be obtained. Here, the pattern of the cured product is removed. However, instead of processing or removing the pattern of the cured product, it may be used as, for example, an interlayer dielectric film included in a semiconductor element or the like, that is, a constituent member of an article.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-192810, filed on Oct. 11, 2018, and Japanese Patent Application No. 2019-166495, filed on Sep. 12, 2019 which are hereby incorporated by reference herein in their entirety.

What is claimed is:

1. An imprint apparatus for forming a pattern in an imprint material on a substrate using an original, comprising:
an image capturing unit configured to capture an image of the substrate; and
a processor configured to perform, based on fine-detection marks and rough-detection marks in the image obtained by the image capturing unit, an alignment process of the original and the substrate prior to forming the pattern in the imprint material on the substrate by performing imprinting, and an overlay inspection process of the substrate and the pattern formed in the imprint material after imprinting,
wherein the processor is configured to change, between the alignment process and the overlay inspection process, a rough-detection mark group to be used to specify positions of fine-detection marks in a first image obtained by the image capturing unit for the first alignment process before imprinting and a second image obtained by the image capturing unit for the overlay inspection process after imprinting.

2. The apparatus according to claim 1, wherein the processor is configured to set, in the image obtained by the image capturing unit, a search area of the rough-detection mark group to be used to specify the positions of the fine-detection marks, such that the search area in the overlay inspection process is wider than the search area in the alignment process.

3. The apparatus according to claim 1, wherein the image capturing unit is configured to capture the image of the substrate at the same magnification in the alignment process the overlay inspection process.

4. The apparatus according to claim 1, wherein
in the alignment process, the processor is configured to specify the positions of the fine-detection marks based on a position of a rough-detection mark group arranged in a first positional relationship in the first image obtained by the image capturing unit, and
in the overlay inspection process, the processor is configured to specify the positions of the fine-detection marks based on a position of a rough-detection mark group arranged in a second positional relationship different from the first positional relationship in the second image obtained by the image capturing unit.

5. The apparatus according to claim 4, wherein in the alignment process,
the image capturing unit is configured to capture the first image of the substrate via the original, and
the rough-detection mark group arranged in the first positional relationship is formed from a rough-detection mark provided in the original and a rough-detection mark provided in the substrate.

6. The apparatus according to claim 4, wherein in the overlay inspection process,
the image capturing unit is configured to capture the second image of the substrate without intervention of the original, and
the rough-detection mark group arranged in the second positional relationship is formed from a rough-detection mark provided in the substrate.

7. The apparatus according to claim 4, wherein the rough-detection mark group arranged in the second positional relationship includes part of a pattern already formed in the substrate.

8. The apparatus according to claim 1, wherein the rough-detection mark group to be used to specify the positions of the fine-detection marks in the alignment process and the rough-detection mark group to be used to specify the positions of the fine-detection marks in the overlay inspection process include at least one common rough-detection mark provided in the substrate.

9. An imprint apparatus for forming a pattern in an imprint material on a substrate using an original, comprising:
    an image capturing unit configured to capture an image of the substrate; and
    a processor configured to perform, based on fine-detection marks and rough-detection marks in the image obtained by the image capturing unit, an alignment process of the original and the substrate prior to forming the pattern in the imprint material on the substrate by performing imprinting, and an overlay inspection process of the substrate and the pattern formed in the imprint material after imprinting,
    wherein the processor is configured to:
        perform the alignment process based on a first image obtained by capturing, by the image capturing unit, a first mark of the substrate and a mark of the original, and
        perform the overlay inspection process based on a second image obtained by capturing a second mark of the substrate by the image capturing unit without intervention of the original, and wherein the first mark and the second mark are provided at different positions on the substrate so that a mark arrangement of the first image is the same as a mark arrangement of the second image.

10. A method of manufacturing an article, comprising:
forming a pattern on a substrate using an imprint apparatus; and
processing the substrate, on which the pattern has been formed, to manufacture the article,
wherein the imprint apparatus forms a pattern in an imprint material on a substrate using an original, and includes:
    an image capturing unit configured to capture an image of the substrate; and
    a processor configured to perform, based on fine-detection marks and rough-detection marks in the image obtained by the image capturing unit, an alignment process of the original and the substrate prior to forming the pattern in the imprint material on the substrate by performing imprinting, and an overlay inspection process of the substrate and the pattern formed in the imprint material after imprinting,
    wherein the processor is configured to change, between the alignment process and the overlay inspection process, a rough-detection mark group to be used to specify positions of fine-detection marks in a first image obtained by the image capturing unit for the alignment process before imprinting and a second image obtained by the image capturing unit for the overlay inspection process after imprinting.

* * * * *